US012757455B2

(12) United States Patent
Park et al.

(10) Patent No.: US 12,757,455 B2
(45) Date of Patent: Oct. 6, 2026

(54) 3D-STACKED SEMICONDUCTOR DEVICE HAVING DIFFERENT CHANNEL AND GATE DIMENSIONS ACROSS LOWER STACK AND UPPER STACK

(71) Applicant: SAMSUNG ELECTRONICS CO., LTD., Suwon-si (KR)

(72) Inventors: Keumseok Park, Slingerlands, NY (US); Sooyoung Park, Halfmoon, NY (US); Kang-Ill Seo, Springfield, VA (US); Jaehong Lee, Latham, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 887 days.

(21) Appl. No.: 17/945,695

(22) Filed: Sep. 15, 2022

(65) Prior Publication Data

US 2023/0352528 A1 Nov. 2, 2023

Related U.S. Application Data

(60) Provisional application No. 63/351,168, filed on Jun. 10, 2022, provisional application No. 63/335,417, filed on Apr. 27, 2022.

(51) Int. Cl.
*H10D 62/10* (2025.01)
*H10D 30/67* (2025.01)
(Continued)

(52) U.S. Cl.
CPC ....... *H10D 62/121* (2025.01); *H10D 30/6757* (2025.01); *H10D 62/151* (2025.01);
(Continued)

(58) Field of Classification Search
CPC ..... H10D 62/119–121; H10D 30/6757; H10D 30/014; H10D 30/019–0194;
(Continued)

(56) References Cited

U.S. PATENT DOCUMENTS 8,274,119 B2 9/2012 Xiao et al.
9,406,697 B1 8/2016 Liu et al.
(Continued)

FOREIGN PATENT DOCUMENTS

DE 10 2019 121 928 A1 3/2020
EP 4270462 A1 11/2023
WO 2023088699 A1 5/2023

OTHER PUBLICATIONS

The Extended European Search Report issued on Sep. 26, 2023 by the European Patent Office for European Patent Application No. 23169191.6.

(Continued)

*Primary Examiner* — Britt Hanley
*Assistant Examiner* — Jason James Greaving
(74) *Attorney, Agent, or Firm* — Myers Bigel, P.A.

(57) ABSTRACT

Provided is a multi-stack semiconductor device including: a substrate; a lower-stack nanosheet transistor including two or more lower channel layers surrounded by a lower gate structure, the lower channel layers connecting lower source/drain regions; and an upper-stack nanosheet transistor formed above the lower-stack nanosheet transistor, and including two or more upper channel layers surrounded by an upper gate structure, the upper channel layers connecting upper source/drain regions, wherein the lower-stack nanosheet transistor and the upper-stack nanosheet transistor have at least one of: a difference between a thickness of one of the lower channel layers and a thickness of one of the upper channel layers; and a difference between a thickness of the lower gate structure between two adjacent lower channel layers and a thickness of the upper gate structure between two adjacent upper channel layers.

23 Claims, 19 Drawing Sheets

(51) Int. Cl.

| | |
|---|---|
| ***H10D 62/13*** | (2025.01) |
| ***H10D 84/01*** | (2026.01) |
| ***H10D 84/83*** | (2025.01) |
| ***H10D 84/85*** | (2025.01) |
| ***H10D 88/00*** | (2026.01) |

(52) U.S. Cl.
CPC ..... *H10D 84/0142* (2025.01); *H10D 84/0179* (2025.01); *H10D 84/8311* (2025.01); *H10D 84/853* (2025.01); *H10D 88/00* (2025.01)

(58) Field of Classification Search
CPC ............... H10D 30/43; H10D 30/6735; H10D 84/8311; H10D 84/8312; H10D 84/0142; H10D 84/0179
See application file for complete search history.

(56) References Cited

U.S. PATENT DOCUMENTS

| | | | | |
|---|---|---|---|---|
| 9,647,098 | B2 | 5/2017 | Obradovic et al. | |
| 9,905,477 | B2 | 2/2018 | Peng | |
| 10,381,438 | B2 | 8/2019 | Zhang et al. | |
| 10,546,925 | B2 | 1/2020 | Reznicek et al. | |
| 10,685,887 | B2 | 6/2020 | Smith et al. | |
| 10,714,391 | B2 | 7/2020 | Smith et al. | |
| 10,741,456 | B2 | 8/2020 | Cheng et al. | |
| 11,158,544 | B2 | 10/2021 | Cheng et al. | |
| 11,164,792 | B2 | 11/2021 | Xie et al. | |
| 2019/0172755 | A1 | 6/2019 | Smith et al. | |
| 2020/0006479 | A1 | 1/2020 | Reznicek et al. | |
| 2020/0098756 | A1* | 3/2020 | Lilak | H10D 62/83 |
| 2020/0168715 | A1* | 5/2020 | Wu | H01L 21/30604 |
| 2020/0219979 | A1 | 7/2020 | Rachmady et al. | |
| 2020/0294866 | A1* | 9/2020 | Cheng | H10D 30/43 |
| 2021/0184000 | A1 | 6/2021 | Ramaswamy et al. | |
| 2021/0265348 | A1 | 8/2021 | Xie et al. | |
| 2021/0375722 | A1 | 12/2021 | Kim et al. | |
| 2021/0375861 | A1 | 12/2021 | Chung et al. | |
| 2021/0408257 | A1 | 12/2021 | Thomas et al. | |
| 2022/0020666 | A1 | 1/2022 | Van Dal et al. | |
| 2022/0037497 | A1 | 2/2022 | Chung et al. | |
| 2022/0109046 | A1 | 4/2022 | Hong et al. | |
| 2022/0157816 | A1 | 5/2022 | Cheng et al. | |
| 2022/0216340 | A1 | 7/2022 | Lin et al. | |
| 2022/0384345 | A1 | 12/2022 | Park et al. | |
| 2023/0052477 | A1 | 2/2023 | Ha et al. | |
| 2023/0163127 | A1 | 5/2023 | Wu et al. | |

OTHER PUBLICATIONS

Communication issued Feb. 2, 2024 by the European Patent Office in European Patent Application No. 23169527.1, 15 pp.
Communication issued on Nov. 30, 2023 by the European Patent Office for European Patent Application No. 23169527.1, 16 pp.
Communication issued on Aug. 31, 2023 by the European Patent Office for European Patent Application No. 23165072.2, 7 pp.

* cited by examiner

3D-STACKED SEMICONDUCTOR DEVICE HAVING DIFFERENT CHANNEL AND GATE DIMENSIONS ACROSS LOWER STACK AND UPPER STACK

CROSS-REFERENCE TO THE RELATED APPLICATION

This application is based on and claims priority from U.S. Provisional Application Nos. 63/335,417 filed on Apr. 27, 2022 and 63/351,168 filed on Jun. 10, 2022 in the U.S. Patent and Trademark Office, the disclosures of which are incorporated herein in their entireties by reference.

BACKGROUND

1. Field

Apparatuses and methods related to the disclosure relate to a three-dimensionally-stacked (3D-stacked) or multi-stack semiconductor device including a lower-stack nanosheet transistor and an upper-stack nanosheet transistor having different structural dimensions.

2. Description of the Related Art

Growing demand for miniaturization and improved performance of a semiconductor device has introduced a nanosheet transistor. The nanosheet transistor is characterized by a channel structure formed of one or more vertically stacked nanosheet channel layers bridging source/drain regions (electrodes) formed at both ends thereof in a channel length direction and a gate structure that surrounds the nanosheet layers. These nanosheet channel layers function as a channel for current flow between the source/drain regions of the nanosheet transistor. The nanosheet transistor is also referred to with various different names such as multi-bridge channel FET (MBCFET), nanobeam, nanoribbon, superimposed channel device, etc.

Recently, a 3D-stacked or multi-stack semiconductor device has begun to attract an industry attention to achieve further device density. This multi-stack semiconductor device may be formed of a lower-stack nanosheet transistor and an upper-stack nanosheet transistor formed on a substrate. Each of the lower- and upper-stack nanosheet transistors may include a plurality semiconductor nanosheet channel layers as its channel structure, and a gate structure surrounding the channel structure.

The inventors of the present application have identified that the device performance of the multi-stack semiconductor device is limited when the lower- and upper-stack nanosheet transistors have the same dimensions in the channel structure and the gate structure.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a multi-stack semiconductor device having an improved device performance and device density due to different dimensions between a lower channel and gate structure and an upper channel and gate structure.

According to an embodiment, there is provided a multi-stack semiconductor device which may include: a substrate; a lower-stack nanosheet transistor including at least one lower channel layer surrounded by a lower gate structure, the at least one lower channel layer connecting lower source/drain regions; and an upper-stack nanosheet transistor formed above the lower-stack nanosheet transistor, and including at least one upper channel layer surrounded by an upper gate structure, the at least one upper channel layer connecting upper source/drain regions, wherein one of the at least one lower channel layer and one of the at least one upper channel layer have different thicknesses.

According to an embodiment, there is provided a multi-stack semiconductor device which may include: a substrate; a lower-stack nanosheet transistor including two or more lower channel layers surrounded by a lower gate structure, the lower channel layers connecting lower source/drain regions; and an upper-stack nanosheet transistor formed above the lower-stack nanosheet transistor, and including two or more upper channel layers surrounded by an upper gate structure, the upper channel layers connecting upper source/drain regions, wherein the upper gate structure between two adjacent upper channel layers and the lower gate structure between two adjacent lower channel layers have different thicknesses.

According to embodiments, there is provided a multi-stack semiconductor device which may include: a substrate; a lower-stack nanosheet transistor including two or more lower channel layers surrounded by a lower gate structure, the lower channel layers connecting lower source/drain regions; and an upper-stack nanosheet transistor formed above the lower-stack nanosheet transistor, and including two or more upper channel layers surrounded by an upper gate structure, the upper channel layers connecting upper source/drain regions, wherein the lower-stack nanosheet transistor and the upper-stack nanosheet transistor have at least one of: a difference between a thickness of one of the lower channel layers and a thickness of one of the upper channel layers; and a difference between a thickness of the lower gate structure between two adjacent lower channel layers and a thickness of the upper gate structure between two adjacent upper channel layers.

BRIEF DESCRIPTION OF DRAWINGS

Example embodiments of the inventive concept will be more clearly understood from the following detailed description taken in conjunction with the accompanying drawings in which.

DETAILED DESCRIPTION OF EXAMPLE EMBODIMENTS

Figure 1A:
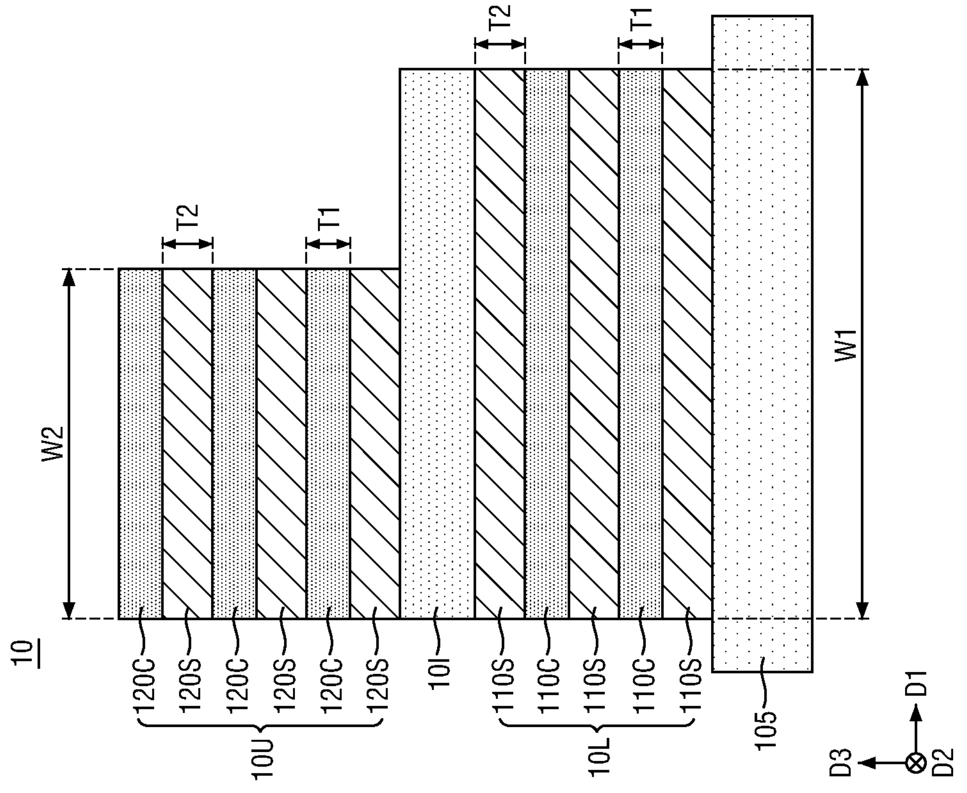
FIGS. 1A and 1B illustrate a channel-width view and a channel-length view of a multi-stack nanosheet structure that will form a multi-stack semiconductor device including a lower-stack nanosheet transistor and an upper-stack nanosheet transistor, according to an embodiment.

The embodiments described herein are all example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers and sacrificial layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms $1^{st}$, $2^{nd}$, $3^{rd}$, $4^{th}$, etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements, structures or layer of semiconductor devices including a nanosheet transistor may or may not be described in detail herein. For example, an etch stop layer or a barrier metal pattern formed on or in a layer or structure of a semiconductor device may be omitted herein.

Herebelow, it is understood that the term "transistor" may refer to a semiconductor device including a channel structure, source/drain regions connected by the channel structure, and a gate structure formed on a substrate.

Figure 1B:
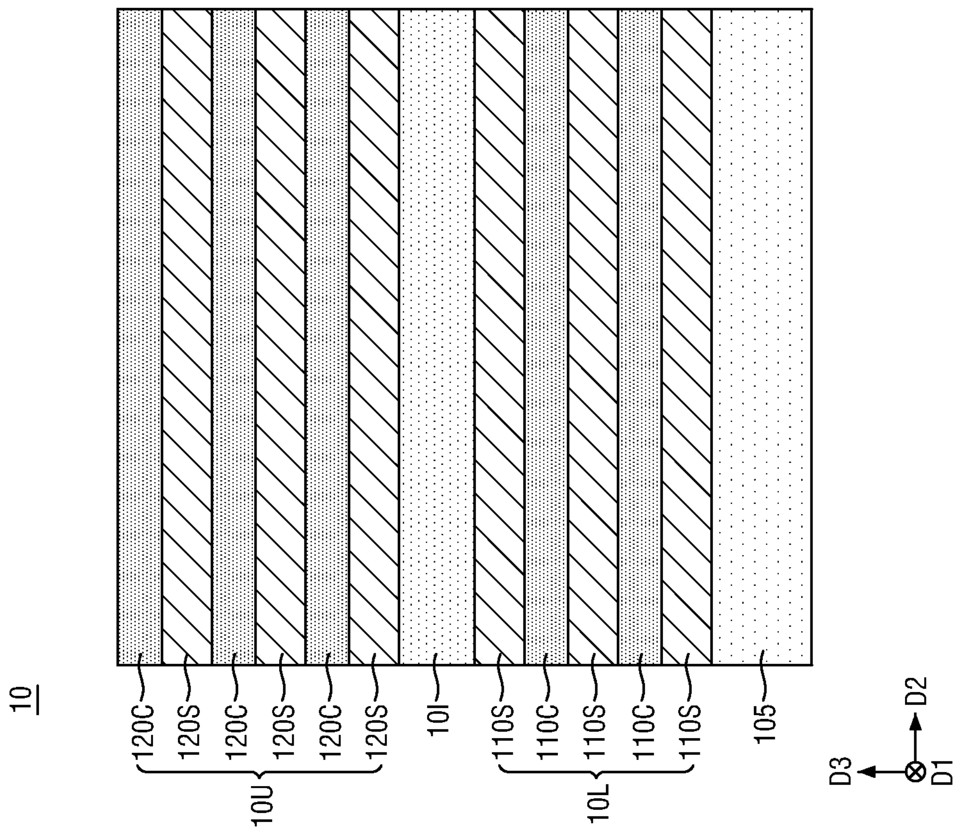

FIGS. 1A and 1B illustrate a channel-width view and a channel-length view of a multi-stack nanosheet structure that will form a multi-stack semiconductor device including a lower-stack nanosheet transistor and an upper-stack nanosheet transistor, according to an embodiment.

Referring to FIGS. 1A and 1B, a multi-stack nanosheet structure 10 according to an embodiment is formed of a lower nanosheet stack 10L on a substrate 105, and an upper nanosheet stack 10U on the lower nanosheet stack 10L with an isolation structure 10I therebetween.

Each of the lower nanosheet stack 10L and the upper nanosheet stack 10U may include a plurality of semiconductor nanosheet layers (hereafter "nanosheet layers") that include a plurality of sacrificial layers and channel layers as described below. For example, the lower nanosheet stack 10L may include three (3) lower sacrificial layers 110S and two (2) lower channel layers 110C alternatingly stacked in a D3 direction on the substrate 105, and the upper nanosheet stack 10U may include three (3) upper sacrificial layers 120S and three (3) lower channel layers 120C alternatingly stacked in the D3 direction on the lower nanosheet stack 10L with the isolation structure 10I therebetween. It is understood here that the D3 direction is perpendicular to a D1 direction, which is a channel-width direction, and a D2 direction, which is a channel-length direction, also perpendicular to the D1 direction.

The lower channel layers 110C and the upper channel layers 120C may be referred to as a lower channel structure and an upper channel structure, respectively, because these layers are to respectively become lower channels and upper channels for current flows in a lower-stack nanosheet transistor and an upper-stack nanosheet transistor of a multi-stack semiconductor device to be formed from the multi-stack nanosheet structure 10. Further, the lower sacrificial layers 1120S and the upper sacrificial layers 120S are referred to as such because, these layers, unlike the channel layers, are to be removed and replaced by a gate structure in a manufacturing process of a multi-stack semiconductor device in the present embodiments.

The substrate 105 may be a silicon (Si) substrate although it may include other materials such as silicon germanium (SiGe), silicon carbide (SiC), not being limited thereto. Each of the sacrificial layers 110S and 120S may include silicon-germanium (SiGe), and each of the channel layers 110C and 120C may include silicon (Si). The isolation structure 10I may be an SiGe layer. Ge concentration in each of the sacrificial SiGe layers 110S and 120S may be set to 25%, for example, while Ge concentration in the isolation structure 10I may be set to 50%, for example, not being limited thereto.

According to an embodiment, the multi-stack nanosheet structure 10 has a stepped shape as the upper nanosheet stack 10U has a smaller width in the D1 direction than the lower nanosheet stack 10L. Thus, a width W1 of each of the lower sacrificial layers 110S and the lower channel layers 110C may be greater than a width W2 of each of the upper sacrificial layers 120S and the upper channel layers 120C, as shown in FIG. 1A. Accordingly, when the multi-stack nanosheet structure 10 is finished as a multi-stack semiconductor device, the upper channel structure formed of the upper channel layers 120C may also have a smaller channel width, that is the width W2, than a channel width, that is the width W1, of the lower channel structure formed of the lower channel layers 110C. For example, the width W1 may be about 45 nm or less, and the width W2 may be about 25 nm or less, not being limited thereto. However, when the multi-stack nanosheet structure 20 is finished as the multi-stack semiconductor device, the lower channel structure and the upper channel structure may have a same length between their respective source/drain regions in the D2 direction, which may be about 21 nm or less, according to an embodiment. This length will become a channel length of the multi-stack semiconductor device.

Figure 14A:
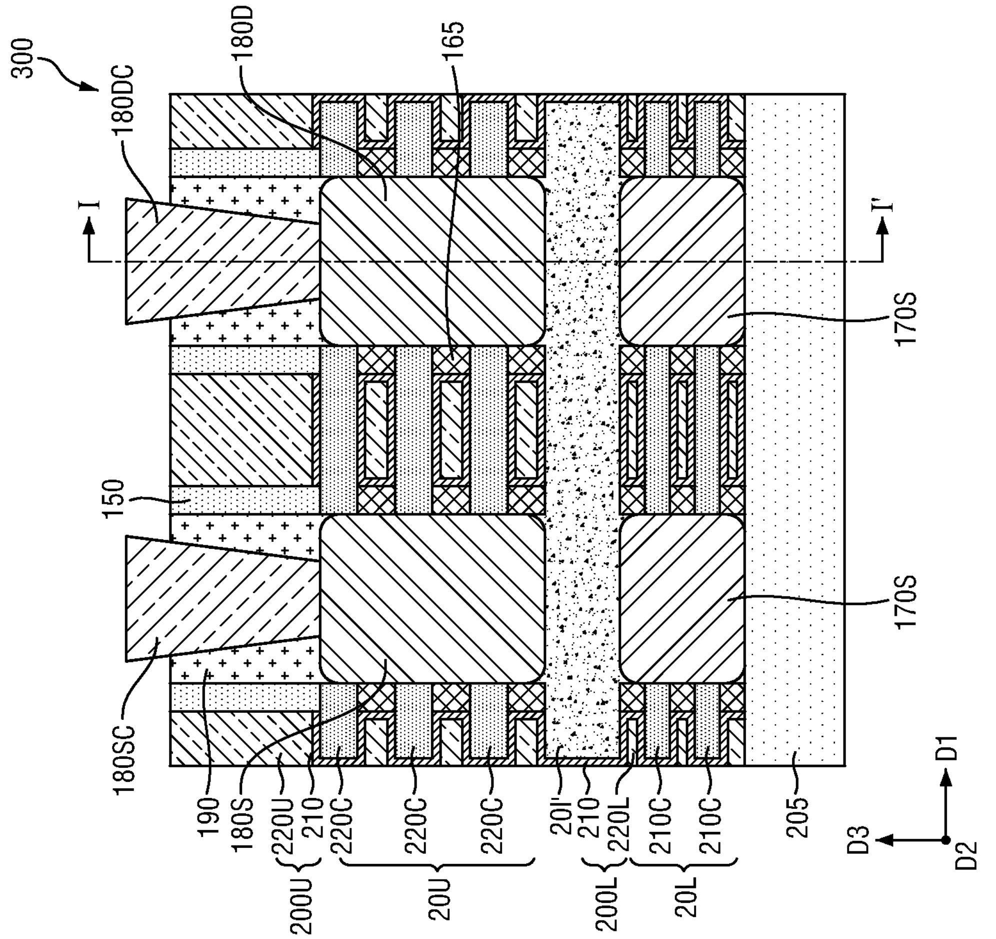
FIG. 14A illustrates a multi-stack semiconductor device in which a lower source/drain region contact structure and an upper source/drain region contact structure are connected to lower source/drain regions and upper source/drain regions, respectively, according to an embodiment.
Figure 14B:
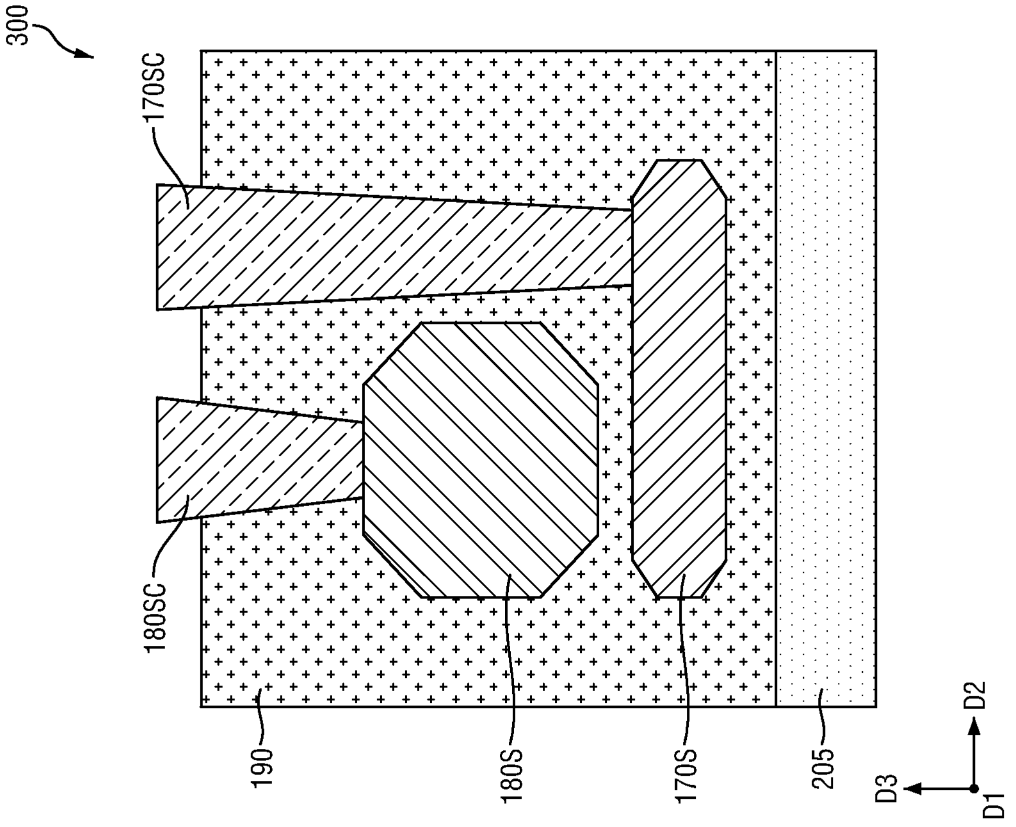
FIG. 14B illustrates a channel-width cross-section view of the multi-stack semiconductor device of FIG. 14A taken along line I-I' shown in FIG. 14A, according to an embodiment.

The multi-stack semiconductor device to be finished from the multi-stack nanosheet structure 10 may have this channel-width difference between the lower channel structure and the upper channel structure to enable a lower source/drain region contact structure (not shown), which is extended down from a back-end-of-line (BEOL) structure (not shown) above the multi-stack semiconductor device, to land on a top surface of a lower source/drain region (not shown) to be formed at one end of the lower channel structure (see FIG. 14B). Otherwise, when the lower channel structure and the upper channel structure have an equal channel width, lower source/drain regions and upper source/drain regions (not shown) formed at both ends of the lower channel structure and both ends of the upper channel structure, respectively, may have an equal width, and then, the lower source/drain region contact structure may have to be bent and connected to a side surface of the lower source/drain region, the manufacturing process of which is more complicated and difficult, and error prone.

In contrast, the upper nanosheet stack 10U may have a greater number of channel layers than the lower nanosheet stack 10L. For example, the number of the upper channel layers 120C is three (3) while the number of the lower channel layers 110C is two (2), although these numbers are not limited thereto. Thus, while the width in the D1 direction is differentiated between the upper nanosheet stack 10U and the lower nanosheet stack 10L for the above reason, a lower-stack nanosheet transistor and an upper-stack nanosheet transistor in a multi-stack semiconductor device to be formed from the multi-stack nanosheet structure 10 may have different numbers of channel layers so that the multi-stack semiconductor device may have a substantially equal effective channel width ($W_{eff}$) between the lower-stack nanosheet transistor and the upper-stack nanosheet transistor. However, the disclosure may not be limited thereto, and, according to embodiments, the lower-stack nanosheet transistor and the upper-stack nanosheet transistor of the multi-stack semiconductor device may or may not have a substantially equal effective channel width depending on a type of a multi-stack semiconductor device to be formed from the multi-stack nanosheet structure 10 considering mobility of holes and electrons passing through the lower channel layers 110C and the upper channel layers 120C, respectively.

In the meantime, the lower channel layers 110C and the upper channel layers 120C may each have a same thickness T1 which may be about 7 nm, and the lower sacrificial layers 110S and the upper sacrificial layers 120S may each have a same thickness T2 which may be about 8 nm, according to an embodiment. The lower sacrificial layers 110S and the upper sacrificial layers 120S having an equal thickness indicates that, when the multi-stack nanosheet structure 10 is finished as a multi-stack semiconductor device, a lower gate structure and an upper gate structure respectively replacing the lower sacrificial layers 110S and the upper sacrificial layers 120S may have the same thickness T2 between the lower channel layers 110C and the upper channel layers, respectively.

According to an embodiment, the lower nanosheet stack 10L and the upper nanosheet stack 10U shown in FIG. 1 may be formed by epitaxially growing and/or depositing nanosheet layers one layer and then the next in the following order: a lower sacrificial layer 110S, a lower channel layer 110C, a lower sacrificial layer 110S, a lower channel layer 110C, a sacrificial layer 110S, the isolation structure 10I, an upper sacrificial layer 120S, an upper channel layer 120C, an upper sacrificial layer 120S, an upper channel layer 120C, an upper sacrificial layer 120S, and an upper channel layer 120C. The epitaxial growth/deposition process may be performed by, for example, applying a silicon-containing gas and/or a germanium-containing case to grow and deposit each nanosheet layer on the substrate 105 by adjusting the gas exposure time so that a desired thickness for the nanosheet layer can be achieved. This epitaxy process may last until a desired number of channel layers and sacrificial layers is formed. However, the above example number of the nanosheet layers 110S, 110C, 10I, 120S and 120C does not limit the disclosure. Further, even if the upper nanosheet stack 10U has an equal number, i.e., three (3), of nanosheet layers for the upper sacrificial layers 120S and for the upper channel layers 120C, another sacrificial layer may be epitaxially grown on the uppermost sacrificial layer 120C so that the upper nanosheet stack 10U may have three (3) upper channel layers 120C and four (4) sacrificial layers 120S, according to an embodiment. Again, the number of nanosheet layers in the lower nanosheet stack 10L and the upper nanosheet stack 10U is not limited to the above examples as long as the upper nanosheet stack 10U having a smaller width than the lower nanosheet stack 10L has a greater number of nanosheet layers than the lower nanosheet stack 10L.

After the nanosheet layers 110S, 110C, 10I, 120S and 120C are formed in the above manner, photolithography and etching operations may be performed thereon to obtain the multi-stack nanosheet structure 10 shown in FIG. 1, as will described later in reference to FIGS. 6A-6B through FIGS. 14A-14B.

In a multi-stack semiconductor device to be formed from the multi-stack nanosheet structure 10 of FIG. 1, a lower-stack transistor including the lower channel layers 110C may form one of a p-type metal-oxide-semiconductor field-effect transistor (PMOS) and an n-type metal-oxide-semiconductor field-effect transistor (NMOS), and an upper-stack transistor including the upper channel layers 120C may form the other of the PMOS and the NMOS, according to embodiments. Thus, the multi-stack semiconductor device may be a complementary metal-oxide-semiconductor (CMOS) device, according to an embodiment. For example, the lower-stack transistor may be an NMOS and the upper-stack transistor may be a PMOS. However, the lower-stack transistor may be a PMOS and the upper-stack transistor may be an NMOS as another example. Subject to design, both of the lower- and upper-stack transistors may be a PMOS or an NMOS in the multi-stack semiconductor device, according to embodiments.

In the above embodiment of the multi-stack nanosheet structure 10, each of the lower channel layers 110C and the upper channel layers 120C may have the same thickness T1, and each of the lower sacrificial layers 110S and the upper sacrificial layers 120S may have the same thickness T2. Thus, a multi-stack semiconductor device based on the multi-stack nanosheet structure 10 may have the lower channel layers 110C and the upper channel layers 120C having the same thickness T1, and the lower gate structure and the upper gate structure having the same thickness T2 at their portions between the lower channel layers 110C and the upper channel layers 120C, respectively, as described above.

However, in order to enhance the device performance and reduce manufacturing complexity of a multi-stack semiconductor device formed from the multi-stack nanosheet structure 10, these channel layer and gate structure thicknesses may be differently set considering mobility of holes and electrons travelling through the channel layers 110C and 120C and short channel effects occurring in the multi-stack semiconductor device.

Figure 5A:
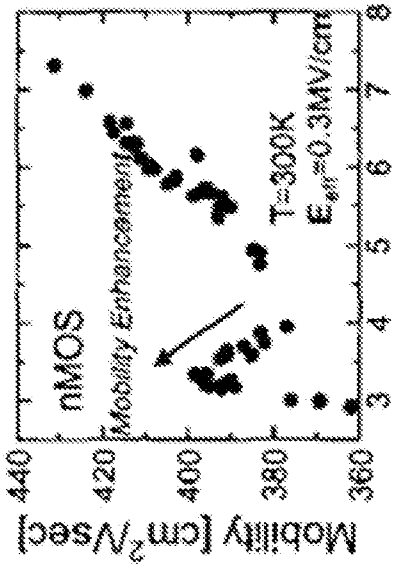
FIGS. 5A and 5B are graphs showing mobility variation in a channel structure of an NMOS and a channel structure of a PMOS according to a thickness of a channel layer of the nanosheet transistor.
Figure 5B:
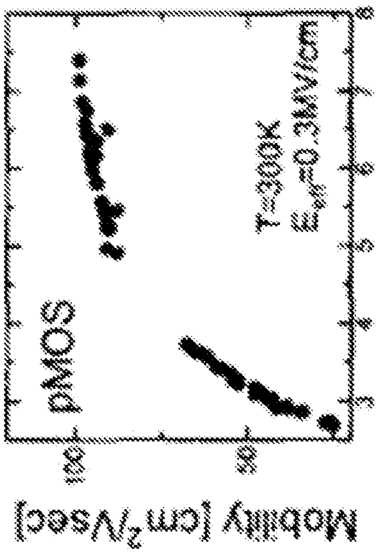

As the thickness of a channel layer in a nanosheet transistor increases, mobility of holes and electrons increases, and also, the short channel effect including contact capacitance also increases around the channel layer and source/drain regions connected by the channel layer. For example, graphs shown in FIGS. 5A and 5B show mobility variation in a channel structure of an NMOS and a channel structure of a PMOS according to a thickness of a channel layer of the nanosheet transistor. Thus, the thickness of a channel layer in a channel structure of the nanosheet transistor along with the thickness of portions of a gate structure between a plurality of channel layers of the channel structure may be adjusted to achieve an optimal performance of the nanosheet transistor. In adjusting the channel layer thicknesses and the gate structure thickness between the channel layers, an entire size of the nanosheet transistor may also be considered in manufacturing the multi-stack semiconductor device as the device density in an integrated circuit including the multi-stack semiconductor device is also a design factor in the field of the semiconductor industry.

Figure 2:
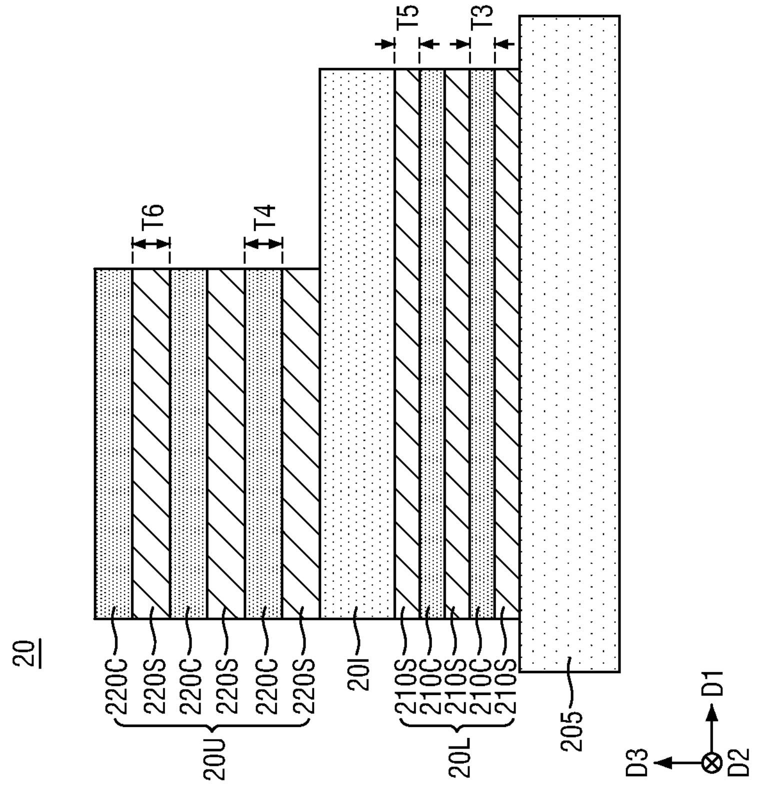
FIGS. 2 to 4 illustrate channel-width views of multi-stack nanosheet structures each of which will form a multi-stack semiconductor device including a lower-stack nanosheet transistor and an upper-stack nanosheet transistor, according to embodiments.
Figure 3:
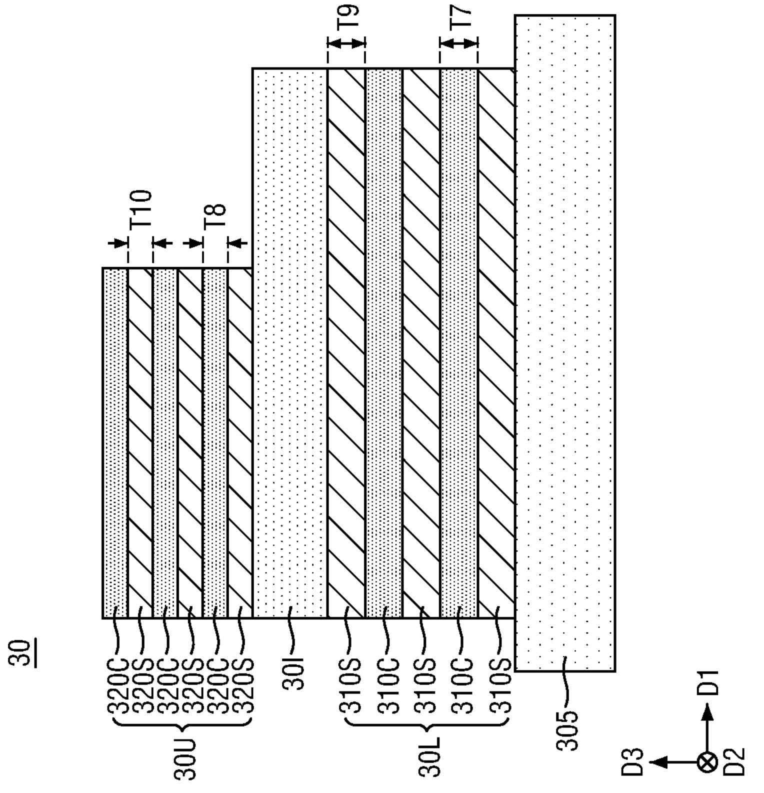
Figure 4:
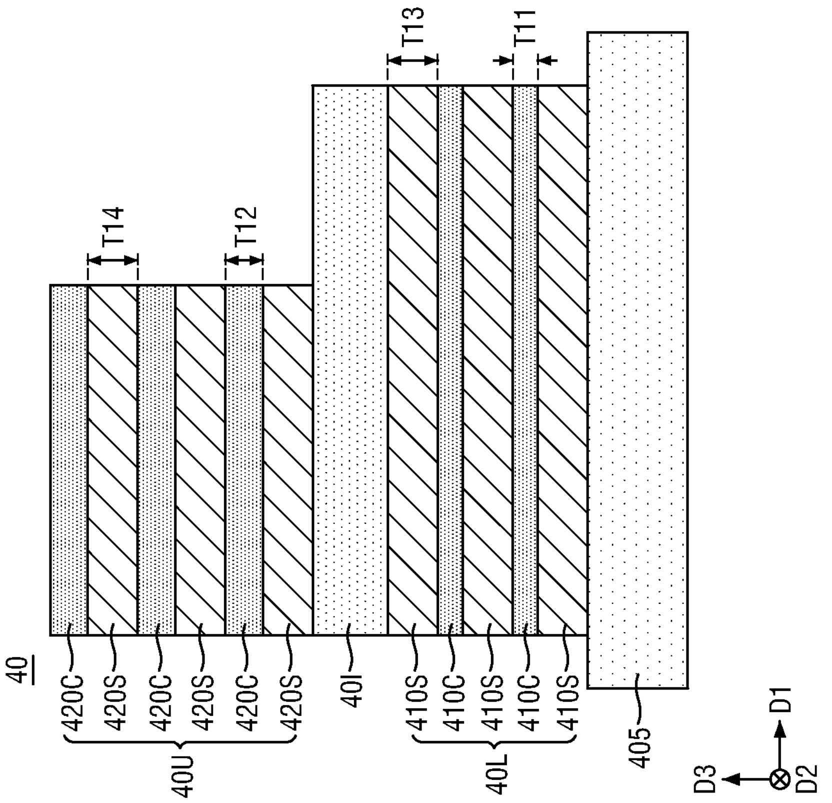

FIGS. 2 to 4 illustrate channel-width views of multi-stack nanosheet structures each of which will form a multi-stack semiconductor device including a lower-stack nanosheet transistor and an upper-stack nanosheet transistor, according to embodiments. Herebelow, a channel-length view, such as FIG. 1B, of each of the multi-stack nanosheet structures shown in FIGS. 2-4 is not separately provided because their channel-length views will be the same or similar to that of the multi-stack nanosheet structure 10, i.e., FIG. 1B, only except thicknesses of a channel layer and a sacrificial layer which will be sufficiently shown in channel-width views of FIGS. 2-4.

Referring to FIG. 2, a multi-stack nanosheet structure 20 may be formed of a lower nanosheet stack 20L on a substrate 205, and an upper nanosheet stack 20U on the lower nanosheet stack 20L with an isolation structure 20I therebetween.

The multi-stack nanosheet structure 20 may also have a stepped shape as the multi-stack nanosheet structure 10 shown in FIGS. 1A and 1B, so that a width of the upper nanosheet stack 20U may be smaller than a width of the lower nanosheet stack 20L for the same purposes as described above for the multi-stack nanosheet structure 10. Thus, duplicate descriptions thereof are omitted herein. Further, like in the multi-stack nanosheet structure 10, the lower nanosheet stack 20L may include two (2) lower channel layers 210C and three (3) lower sacrificial layers 210S, and the upper nanosheet stack 20U may include three (3) upper channel layers 220C and three (3) upper sacrificial layers 220S. Again, these numbers of nanosheet layers in the lower nanosheet stack 20L and the upper nanosheet stack 20U may not be limited thereto as long as the upper nanosheet stack 20U may have a greater number of channel layers than the lower nanosheet stack 20L. Materials forming each element of the multi-stack nanosheet structure 20 may be the same as or similar to those of the multi-stack nanosheet structure 10 shown in FIGS. 1A and 1B, and thus, duplicate descriptions thereof are omitted herein.

However, unlike the multi-stack nanosheet structure 10, a thickness of each of the upper channel layers 220C may be different from a thickness of each of the lower channel layers 210C, and a thickness of each of the upper sacrificial layers 220S may be different from a thickness of each of the lower sacrificial layers 210S as described below, according to embodiments.

In the multi-stack nanosheet structure 20, the lower nanosheet stack 20L may be provided to form a lower channel and gate structure of a PMOS in a multi-stack semiconductor device to be formed from the multi-stack nanosheet structure 20, and the upper nanosheet stack 20U may be provided to form an upper channel and gate structure of an NMOS in the multi-stack semiconductor device.

According to an embodiment, each of the lower channel layers 210C may have a thickness T3 which is different from a thickness T4 of each of the upper channel layers 220C, and each of the lower sacrificial layers may have a thickness T5 which is different from a thickness T6 of each of the upper sacrificial layers 220S, as shown in FIG. 2. In contrast, the thickness T3 of each lower channel layer 210C may be equal to the thickness T5 of each lower sacrificial layer 210S, and the thickness T4 of each upper channel layer 220C may be equal to the thickness T6 of each upper sacrificial layer 220S.

According to an embodiment, the thickness T3 of each lower channel layer 210C provided to form an NMOS channel structure may be about 4-5 nm, while the thickness T4 of each upper channel layer 220C provided to form a PMOS channel structure may be about 6-7 nm. According to an embodiment, the thickness T5 of each lower sacrificial layer 210S, which will be replaced by a portion of a lower gate structure for the NMOS in a multi-stack semiconductor device, may be about 4-5 nm, while the thickness T6 of each upper sacrificial layer 220S, which will be replaced by a portion of an upper gate structure for the PMOS in the multi-stack semiconductor device, may be about 6-7 nm.

As described above, the above dimensions of the multi-stack nanosheet structure 20 may be provided to achieve an optimal performance of the multi-stack semiconductor device based on the multi-stack nanosheet structure 20 in terms of carrier mobility and a short channel effect. Further, as the channel layers 210C, 220C and the sacrificial layers 210S, 220S have smaller thicknesses than those of the embodiment shown in FIG. 1, device density may also be relatively improved.

Referring to FIG. 3, a multi-stack nanosheet structure 30 may be formed of a lower nanosheet stack 30L on a substrate 305, and an upper nanosheet stack 30U on the lower nanosheet stack 30L with an isolation structure 30I therebetween.

The multi-stack nanosheet structure 30 may also have a stepped shape as the multi-stack nanosheet structure 20 shown in FIG. 2, so that a width of the upper nanosheet stack 30U may be smaller than a width of the lower nanosheet stack 30L for the same purposes as described above for the multi-stack nanosheet structure 10. Thus, duplicate descriptions thereof are omitted herein. Further, like in the multi-stack nanosheet structure 10, the lower nanosheet stack 30L may include two (2) lower channel layers 310C and three (3) lower sacrificial layers 310S, and the upper nanosheet stack 30U may include three (3) upper channel layers 320C and three (3) upper sacrificial layers 320S. Again, these numbers of nanosheet layers in the lower nanosheet stack 30L and the upper nanosheet stack 30U may not be limited thereto as long as the upper nanosheet stack 30U may have a greater number of channel layers than the lower nanosheet stack 30L. Materials forming each element of the multi-stack nanosheet structure 30 may be the same as or similar to those of the multi-stack nanosheet structure 20 shown in FIG. 2, and thus, duplicate descriptions thereof are omitted herein.

Like in the multi-stack nanosheet structure 20, a thickness of each of the upper channel layers 320C in the multi-stack nanosheet structure 30 may be different from a thickness of each of the lower channel layers 310C, and a thickness of each of the upper sacrificial layers 320S may be different from a thickness of each of the lower sacrificial layers 310S as described below, according to embodiments.

In the multi-stack nanosheet structure 30, the lower nanosheet stack 30L may be provided to form a lower channel and gate structure of a PMOS in a multi-stack semiconductor device to be formed from the multi-stack nanosheet structure 30, and the upper nanosheet stack 30U may be provided to form an upper channel and gate structure of an NMOS nanosheet transistor in the multi-stack semiconductor device. This may be a CMOS structure reversed from the structure of the multi-stack nanosheet structure 20 shown in FIG. 2.

According to an embodiment, each of the lower channel layers 310C may have a thickness T7 which is different from a thickness T8 of each of the upper channel layers 320C, and each of the lower sacrificial layers may have a thickness T9 which is different from a thickness T10 of each of the upper sacrificial layers 320S, as shown in FIG. 3. In contrast, the thickness T7 of each lower channel layer 310C may be equal to the thickness T9 of each lower sacrificial layer 310S, and the thickness T8 of each upper channel layer 320C may be equal to the thickness T10 of each upper sacrificial layer 320S.

According to an embodiment, the thickness T7 of each lower channel layer 310C provided to form a PMOS channel structure may be about 6-7 nm, while the thickness T8 of each upper channel layer 320C provided to form an NMOS channel structure may be about 4-5 nm. According to an embodiment, the thickness T9 of each lower sacrificial layer 310S, which will be replaced by a portion of a lower gate structure for the PMOS in a multi-stack semiconductor device, may be about 6-7 nm, while the thickness T10 of each upper sacrificial layer 320S, which will be replaced by a portion of an upper gate structure for the NMOS in the multi-stack semiconductor device, may also be about 4-5 nm.

As described above, the above dimensions of the multi-stack nanosheet structure 30 may be provided also to achieve an optimal performance of the multi-stack semiconductor device based on the multi-stack nanosheet structure 30 in terms of carrier mobility and a short channel effect. Further, as the channel layers 310C, 320C and the sacrificial layers 310S, 320S have smaller thicknesses than those of the embodiment shown in FIG. 1, device density may also be relatively improved.

Referring to FIG. 4, a multi-stack nanosheet structure 40 may be formed of a lower nanosheet stack 40L on a substrate 405, and an upper nanosheet stack 40U on the lower nanosheet stack 40L with an isolation structure 401 therebetween.

The multi-stack nanosheet structure 40 may also have a stepped shape as the multi-stack nanosheet structure 20 shown in FIG. 2, so that a width of the upper nanosheet stack 20U may be smaller than a width of the lower nanosheet stack 20L for the same purposes as described above for the multi-stack nanosheet structure 20. Thus, duplicate descriptions thereof are omitted herein. Further, like in the multi-stack nanosheet structure 20, the lower nanosheet stack 40L may include two (2) lower channel layers 410C and three (3) lower sacrificial layers 410S, and the upper nanosheet stack 40U may include three (3) upper channel layers 420C and three (3) upper sacrificial layers 420S. Again, these numbers of nanosheet layers in the lower nanosheet stack 40L and the upper nanosheet stack 40U may not be limited thereto as long as the upper nanosheet stack 40U may have a greater number of channel layers than the lower nanosheet stack 40L. Materials forming each element of the multi-stack nanosheet structure 40 may be the same as or similar to those of the multi-stack nanosheet structure 20 shown in FIG. 2, and thus, duplicate descriptions thereof are omitted herein.

Like in the multi-stack nanosheet structure 20, a thickness of each of the upper channel layers 420C in the multi-stack nanosheet structure 40 may be different from a thickness of each of the lower channel layers 410C, according to an embodiment. However, unlike in the multi-stack nanosheet structure 20 but like in the multi-stack nanosheet structure 10, a thickness of each of the upper sacrificial layers 420S may be equal to a thickness of each of the lower sacrificial layers 410S as described below, according to an embodiment.

In the multi-stack nanosheet structure 40, the lower nanosheet stack 30L may be provided to form a lower channel and gate structure of a NMOS nanosheet transistor in a multi-stack semiconductor device to be formed from the multi-stack nanosheet structure 40, and the upper nanosheet stack 40U may be provided to form an upper channel and gate structure of a PMOS in the multi-stack semiconductor device.

According to an embodiment, each of the lower channel layers 410C may have a thickness T11 which is different from a thickness T12 of each of the upper channel layers 420C, but each of the lower sacrificial layers may have a thickness T13 which is equal to a thickness T14 of each of the upper sacrificial layers 420S, as shown in FIG. 4.

According to an embodiment, the thickness T11 of each lower channel layer 410C provided to form an NMOS channel structure may be about 4-5 nm, while the thickness T12 of each upper channel layer 420C provided to form a PMOS channel structure may be about 6-7 nm. According to an embodiment, the thickness T13 of each lower sacrificial layer 410S, which will be replaced by a portion of a lower gate structure for the NMOS in a multi-stack semiconductor device, may be about 8 nm, while the thickness T14 of each upper sacrificial layer 420S, which will be replaced by a portion of an upper gate structure for the PMOS in the multi-stack semiconductor device, may also be about 8 nm.

As described above, the above dimensions of the multi-stack nanosheet structure 40 are provided also to achieve an optimal performance of the multi-stack semiconductor device based on the multi-stack nanosheet structure 40 in terms of carrier mobility and a short channel effect. Further, as the channel layers 410C, 420C and the sacrificial layers 410S, 420S have smaller thicknesses than those of the embodiment shown in FIG. 1, device density may also be relatively improved. In addition, in the multi-stack nanosheet structure 40, the thicknesses T13, T14 of the sacrificial layers 410S, 420A are greater than the thicknesses T11, T12 of the channel layers 410C, 420C, and thus, formation of a gate structure that replaces the sacrificial layers 410S, 420S may provide a greater process margin than in the multi-stack nanosheet structures 10, 20 and 30.

In the above embodiments described in reference to FIGS. 2 to 4, the respective multi-stack nanosheet structure 20-40 have channel layers and sacrificial layers having different or adjusted thicknesses across the lower stack and the upper stack so that multi-stack semiconductor devices to be formed from the multi-stack nanosheet structure 20-40 may have better performance than a multi-stack semiconductor device to be formed from the multi-stack nanosheet structure 10. Here, all of the multi-stack nanosheet structures 10-40 may have different channel widths across the lower stack and the upper stack as shown in FIGS. 1A-1B to 4. However, this thickness differentiation and adjustment of channel layers and sacrificial layers may also apply to a multi-stack nanosheet structure having a same width across the lower stack and the upper stack although an multi-stack semiconductor device to be formed from this multi-stack nanosheet structure may have difficulty in the formation source/drain region contact structures as described above.

In the following descriptions, a method of manufacturing a multi-stack semiconductor device based a multi-stack nanosheet structure such as the multi-stack nanosheet structures 10 to 40 is provided.

FIGS. 6A-6B through FIGS. 14A-14B illustrate a method for manufacturing a multi-stack semiconductor device having different channel and gate structure dimensions between a lower-stack nanosheet transistor and an upper-stack nanosheet transistor in the multi-stack semiconductor device, according to an embodiment.

It is understood that since methods of manufacturing a multi-stack semiconductor device from each of the multi-stack nanosheet structures 20 to 40 shown in FIGS. 2 to 4 may be similar to one another, the method described herebelow is based on the multi-stack nanosheet structure 20 of FIG. 2.

Figure 6A:
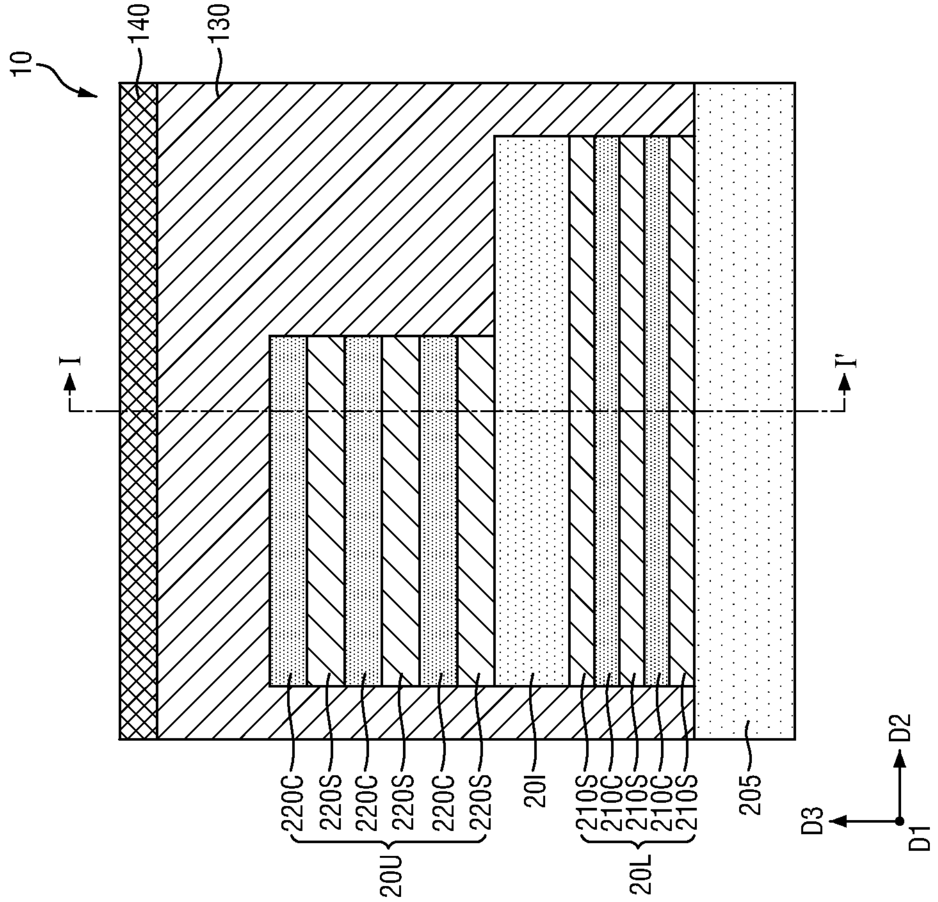
FIG. 6A illustrates a channel-length cross-section view a multi-stack nanosheet structure and a plurality of dummy gate structures formed thereon, according to an embodiment.
Figure 6B:
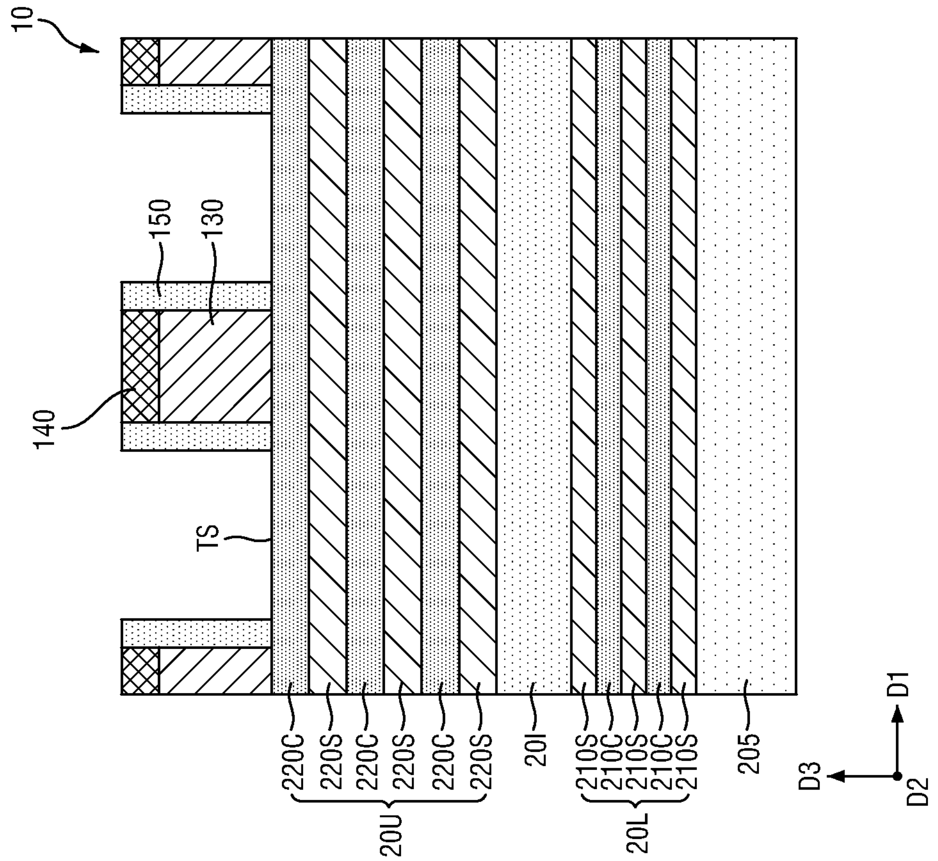
FIG. 6B illustrates a channel-width cross-section view of the multi-stack nanosheet structure of FIG. 6A taken along a line I-I' shown in FIG. 6A, according to an embodiment.

FIG. 6A illustrates a channel-length cross-section view a multi-stack nanosheet structure and a plurality of dummy gate structures formed thereon, according to an embodiment. FIG. 6B illustrates a channel-width cross-section view of the multi-stack nanosheet structure of FIG. 6A taken along a line I-I' shown in FIG. 6A, according to an embodiment.

Referring to FIGS. 6A and 6B, a dummy gate structure 130 may be formed to surround a multi-stack nanosheet structure 20 of FIG. 2 across the D2 direction, which is the channel-width direction. In addition, a hard mask pattern 140 may be formed on a top surface of the dummy gate structure 130, and a gate spacer 150 may be formed on side surfaces of the dummy gate structure 130.

FIG. 6B shows that two additional dummy gate structures may be formed at sides of the dummy gate structure 130 on the multi-stack nanosheet structure 20. These two dummy gate structures are shown there only in the form of partial structure to indicate that a desired number of dummy gate structures can be formed to surround the multi-stack nanosheet structure 20 in the D2 direction, and a corresponding lower channel structure and a corresponding upper channel structure can be formed therebelow.

In subsequent steps, the dummy gate structure 130, the hard mask pattern 140, and the gate spacer 150 may be used as a mask structure to divide the multi-stack nanosheet structure 20 into a plurality of multi-stack nanosheet structures, and form inner spacers of the lower nanosheet transistors and the upper nanosheet transistors of a multi-stack semiconductor device manufactured from the multi-stack nanosheet structure 20.

The hard mask pattern 140 may be used to obtain the dummy gate structure 130 as shown in FIGS. 6A and 6B from a dummy gate material (not shown) deposited on an entire top surface of the multi-stack nanosheet structure 20 of FIG. 2. The dummy gate structure 130 may include amorphous silicon or amorphous carbon, not being limited thereto, and the hard mask pattern 140 may include silicon nitride (e.g., SiN), silicon dioxide (e.g., $SiO_2$) or silicon carbide (SiC), not being limited thereto. Based on the hard mask pattern 140, the dummy gate structure 130 may be formed through, for example, photolithography and anisotropic etching, not being limited thereto. The gate spacer 150 may include a material such as silicon nitride, silicon carbonitride or silicon oxycarbonitride, not being limited thereto, and may be formed on the side surfaces of the dummy gate structure 130 through, for example, a sidewall image transfer (SIT) process and dry etching such as reactive ion etching (RIE), not being limited thereto.

Figure 7:
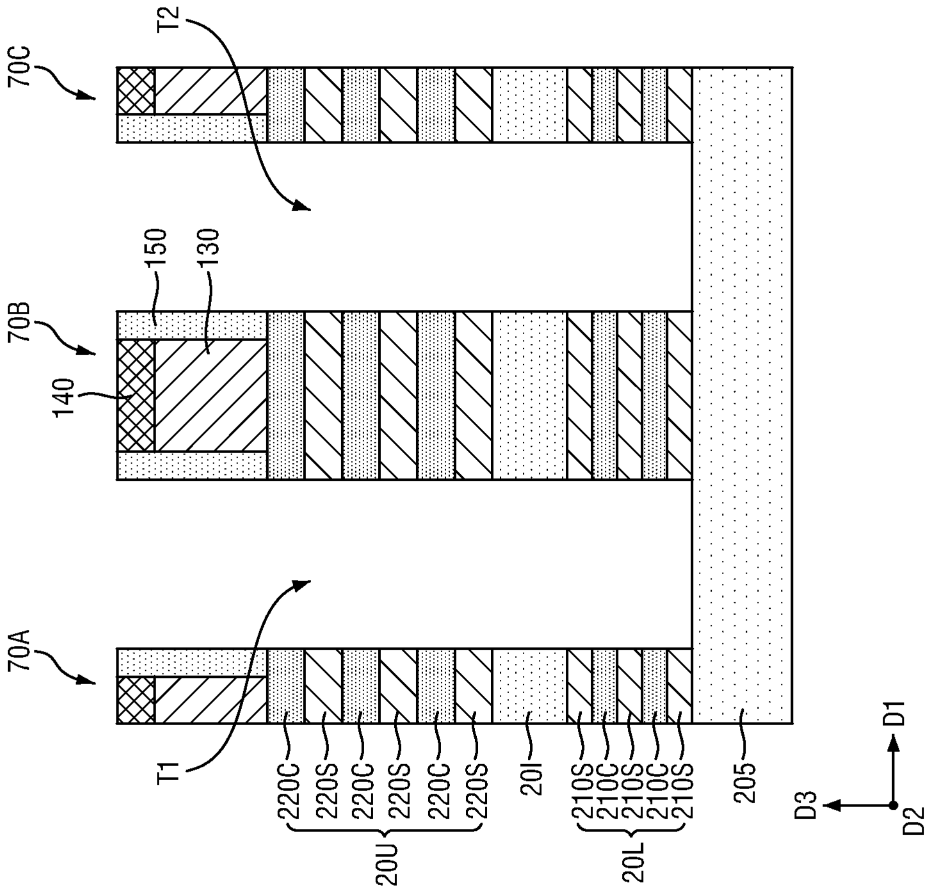
FIG. 7 illustrates a channel-length cross-section view of a multi-stack nanosheet structure which is divided into a plurality of multi-stack nanosheet structures based on dummy gate structures with gate spacers and a hard mask pattern on side and top surfaces thereof, according to an embodiment.

FIG. 7 illustrates a channel-length cross-section view of a multi-stack nanosheet structure which is divided into a plurality of multi-stack nanosheet structures based on dummy gate structures with gate spacers and a hard mask pattern on side and top surfaces thereof, according to an embodiment.

Referring to FIG. 7, the multi-stack nanosheet structure 20 of FIGS. 6A and 6B may be divided into a plurality of multi-stack nanosheet structures 70A to 70C on the substrate 205. These multi-stack nanosheet structures may be obtained by etching the multi-stack nanosheet structure 20 from top surfaces TS thereof exposed between the dummy gate structures 130 with respective hard mask patterns 140 and gate spacers 150 on the side and top surfaces thereof. For example, reactive ion etching (RIE) may be performed from the exposed top surfaces TS of the multi-stack nanosheet structure 20 down to the substrate 105 using the dummy gate structures 130 with respective hard mask patterns 140 and gate spacers 150 thereon as a mask structure for the etching operation.

By this etching operation, two trenches T1 and T2 exposing a top surface of the substrate 205 upward may be obtained. Although not shown, when a certain isolation layer is formed on the top surface of the substrate 105 when the multi-stack nanosheet structure 20 of FIG. 2 is formed, a top surface of this isolation layer instead of the top surface of the substrate 205 may be exposed through the trenches T1 and T2.

In the trenches T1 and T2, each of the multi-stack nanosheet structures 70A to 70C may expose side surfaces of a corresponding lower channel structure and a corresponding upper channel structure and an isolation structure therebetween obtained from the lower nanosheet stack 20L and the upper nanosheet stack and the isolation structure 20I therebetween as included in the multi-stack nanosheet structure 20 of FIG. 2. In other words, the trenches T1 and T2 may expose side surfaces of the lower channel layers 210C and the lower sacrificial layers 210S in each lower nanosheet stack 20L, side surfaces of the isolation structure 20I, and side surfaces of the upper channel layers 220C and the upper sacrificial layers 220S in each upper nanosheet stack 20U.

Figure 8:
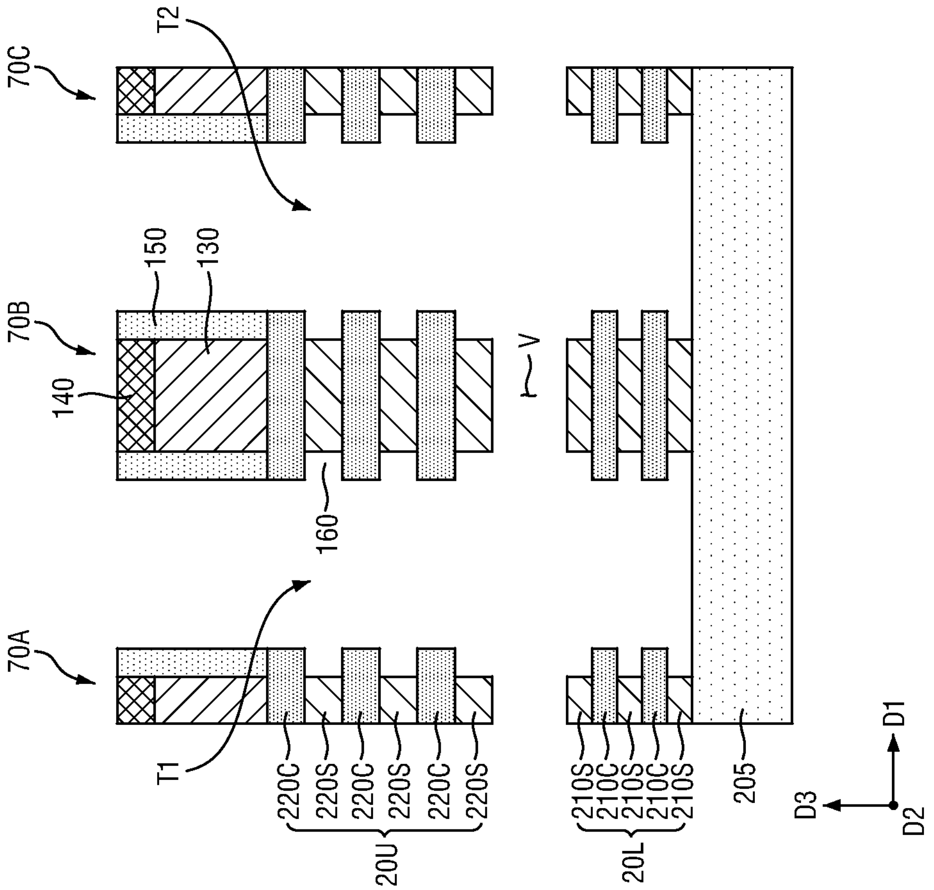
FIG. 8 illustrates a channel-length cross-section view of a plurality of multi-stack nanosheet structures in which an isolation structure is removed for isolation layer formation, and side portions of sacrificial layers below gate spacers are removed for inner spacer formation, according to an embodiment.

FIG. 8 illustrates a channel-length cross-section view of a plurality of multi-stack nanosheet structures in which an isolation structure is removed for isolation layer formation, and side portions of sacrificial layers below gate spacers are removed for inner spacer formation, according to an embodiment.

Referring to FIG. 8, selective etching operations may be performed on the isolation structure 20I and side surfaces of the multi-stack nanosheet structures 70A to 70C. These etching operations may pull back or etch away the isolation structure 20I and side portions of the sacrificial layers 210S and 220S underlying below the gate spacer 150 of each of the multi-stack nanosheet structures 70A to 70C. For example, isotropic etching operations using, for example, a hydrogen chloride, wet chemical etching and/or dry plasma etching may be used for these selective etching operations.

Through the selective etching operations, the isolation structure 20I may be removed, and a side portion of each of the sacrificial layers 210S and 220S underlying below the gate spacer 150 may be removed. Thus, a void V may be formed between the lower nanosheet stack 20L and the upper nanosheet stack 20U, and respective cavities (or grooves) 160 may be formed at sides of the sacrificial layers 210S and 220S in the trenches T1 and T2, as shown in FIG. 8. As described in a subsequent step, the void V and these cavities 160 may be provided for formation of an isolation layer and inner spacers.

Due to the selective etching operations forming the cavities 160 in this step, a length of each of the sacrificial layers 210S and 220S may be reduced by a width of the gate spacer 150 in the D1 direction, that is, the channel-length direction.

Figure 9:
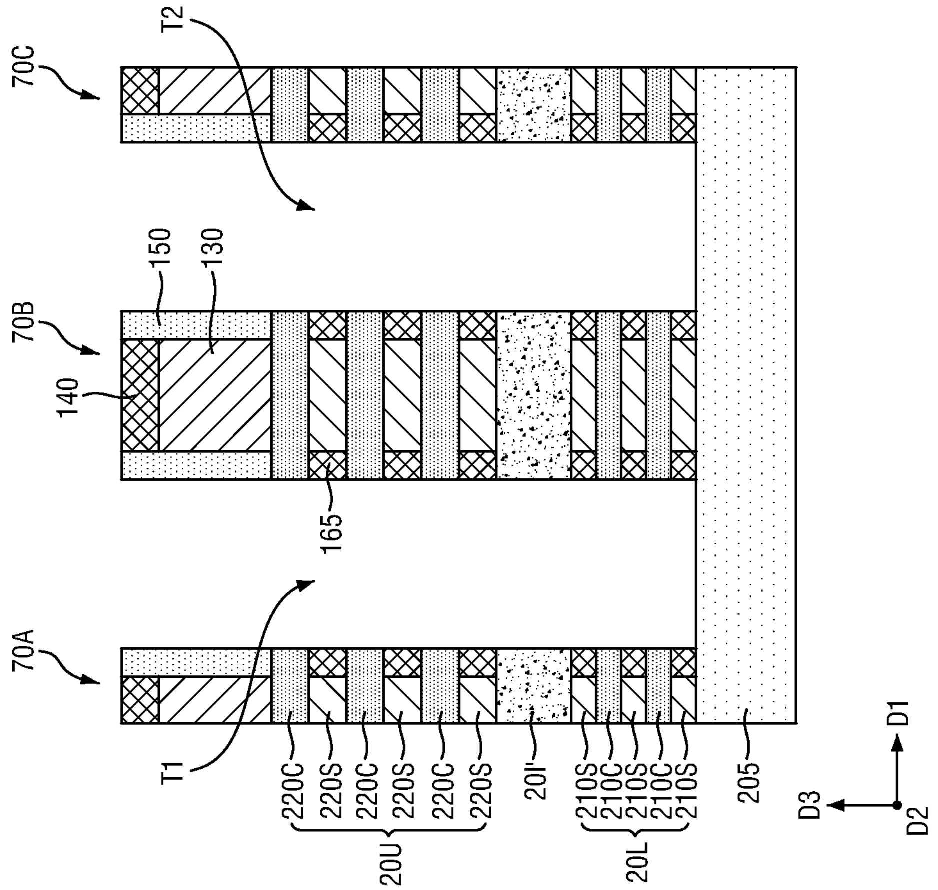
FIG. 9 illustrate a channel-length cross-section view of a plurality of multi-stack nanosheet structure, in each of which an isolation layer and inner spacers are formed, according to an embodiment.

FIG. 9 illustrate a channel-length cross-section view of a plurality of multi-stack nanosheet structure, in each of which an isolation layer and inner spacers are formed, according to an embodiment.

Referring to FIG. 9, the void V obtained in the previous step may be filled in with an isolation layer 20I' and the cavities 160 formed in the nanosheet stacks 30A to 30C of FIG. 4 may be filled in with an inner spacer material to form inner spacers 165 therein. The isolation layer 20I' may be formed of silicon nitride, for example, not being limited thereto. The inner spacer material may include one or more materials including silicon nitride, silicon oxide, silicon oxynitride, silicon oxycarbide, silicon boron carbonitride, silicon oxy carbonitride, and/or silicon carbide), not being limited thereto. One or more material (e.g., silicon nitride) may be deposited in the void V to form the isolation layer 20I' through, for example, atomic layer deposition (ALD), plasma enhanced atomic layer deposition (PEALD), chemical vapor deposition (CVD), plasma enhanced chemical vapor deposition (PECVD), or combinations thereof, followed by isotropic wet chemical etching or dry etching, not being limited thereto, to remove the inner spacer material(s) not vertically below the gate spacer 150 and the upper channel layers 220C. Also, the inner spacer material(s) may be conformally deposited on the cavities 160 to form the inner spacers 165 by, for example, ALD, PEALD, CVD, PECVD, or combinations thereof, followed by isotropic wet chemical etching or dry etching, not being limited thereto, to remove the inner spacer material(s) not vertically below the gate spacer 150, the channel layers 210C and 220C.

Each of the inner spacers 165 may have a thickness substantially equal to that of a corresponding sacrificial layer 110S, 120S or sacrificial isolation layer 115S.

Due to these deposition and subsequent etching operation, side surfaces of the isolation layer 20I', the inner spacers 165, the channel layers 210C and 220C exposed in the trenches T1 and T2 may all vertically coplanar, as shown in FIG. 9.

Figure 10:
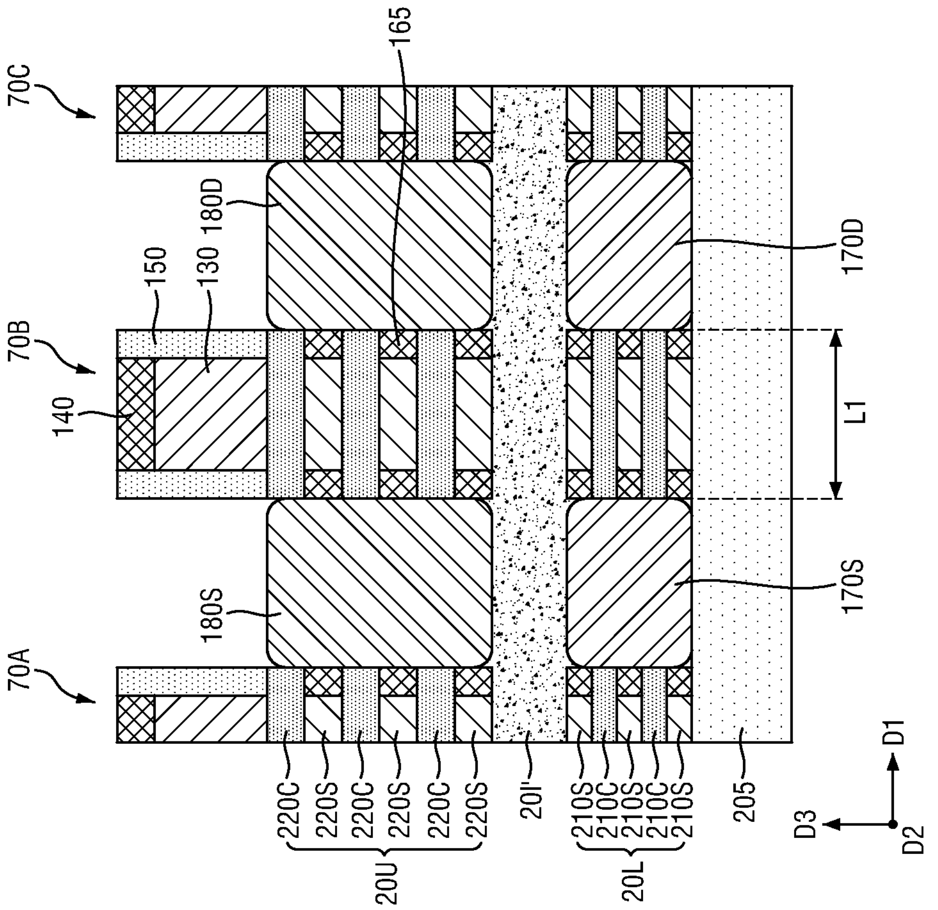
FIG. 10 illustrate a channel-length cross-section view of a plurality of multi-stack nanosheet structures where source/drain regions are formed at both ends of each of a lower channel structure and an upper channel structure, according to an embodiment.

FIG. 10 illustrate a channel-length cross-section view of a plurality of multi-stack nanosheet structures where source/drain regions are formed at both ends of each of a lower channel structure and an upper channel structure, according to an embodiment.

As shown in FIG. 10, lower source/drain regions 170S, 170D and upper source/drain regions 180A, 180D are respectively formed at both ends of the lower nanosheet stack 20L and both ends of the upper nanosheet stack 20U of the multi-stack nanosheet structures 70A to 70C of FIG. 7. Here, the both ends of the nanosheet stacks 20L and 20U refer to two opposite ends of each nanosheet stack in the channel-length direction, that is, the D1 direction.

For example, the lower source/drain region 170S may be epitaxially grown from the lower channel layers 210C of the multi-stack nanosheet structures 70A and 70B and the substrate 205 of FIG. 9, and the lower source/drain region 170D may be epitaxially grown from the lower channel layers 210C of the multi-stack nanosheet structures 70B and 70C and the substrate 205 of FIG. 9. In a similar manner, the upper source/drain region 180S may be epitaxially grown from the upper channel layers 220C of the multi-stack nanosheet structures 70A and 70B, and the upper source/drain region 180D may be epitaxially grown from the upper channel layers 220C of the multi-stack nanosheet structures 70B and 70C. Thus, the lower source/drain regions 170S, 170D and the upper source/drain regions 180S, 180D may include a material(s) similar to that included in the channel layers 210C and 220C. For example, the material(s) of these source/drain regions may be Si or SiGe, not being limited thereto.

The lower source/drain regions 170S and 170D may be doped with one or more n-type dopants such as arsenic or phosphorous, and the upper source/drain regions 180S and 180D may be doped with one or more p-type dopants such as boron, not being limited thereto, so that the lower nanosheet stack 20L and the upper nanosheet stack 20U may form a PMOS and an NMOS, respectively.

As the source/drain regions 170S, 170D, 180S and 180D are formed from the channel layers 210C and 220C, these source/drain regions may be connected to the channel layers 210C and 220C, respectively. However, these source/drain regions may be isolated from the sacrificial layers 210S and 220S by the inner spacers 165.

According to an embodiment, a length L1 of the channel structure including the channel layers 210C and 220C between the source regions 170S, 180S and the drain regions 170D, 180D may be smaller than a length of a corresponding channel structure of a multi-stack semiconductor device formed from the multi-stack nanosheet structure 10. This length gain may be achieve as the thicknesses of the channel layers 210C, 220C and the sacrificial layers 210S, 220S of the multi-stack nanosheet structure 20 are smaller than the channel layers 110C, 120C and the sacrificial layers 110S, 120S of the multi-stack nanosheet structure 10. At least for the same reason, a length of a channel structure of a multi-stack semiconductor device formed from each of the multi-stack nanosheet structure 30 and 40 may also be smaller than the length of the channel structure of the multi-stack semiconductor device formed from the multi-stack nanosheet structure 10. For example, the length of each multi-stack semiconductor device, including the length L1, formed from each of the multi-stack nanosheet structures 20 to 40 may be about 21 nm, while the length of the multi-stack semiconductor device formed from the multi-stack nanosheet structure 10 may be about 21 nm.

Figure 11:
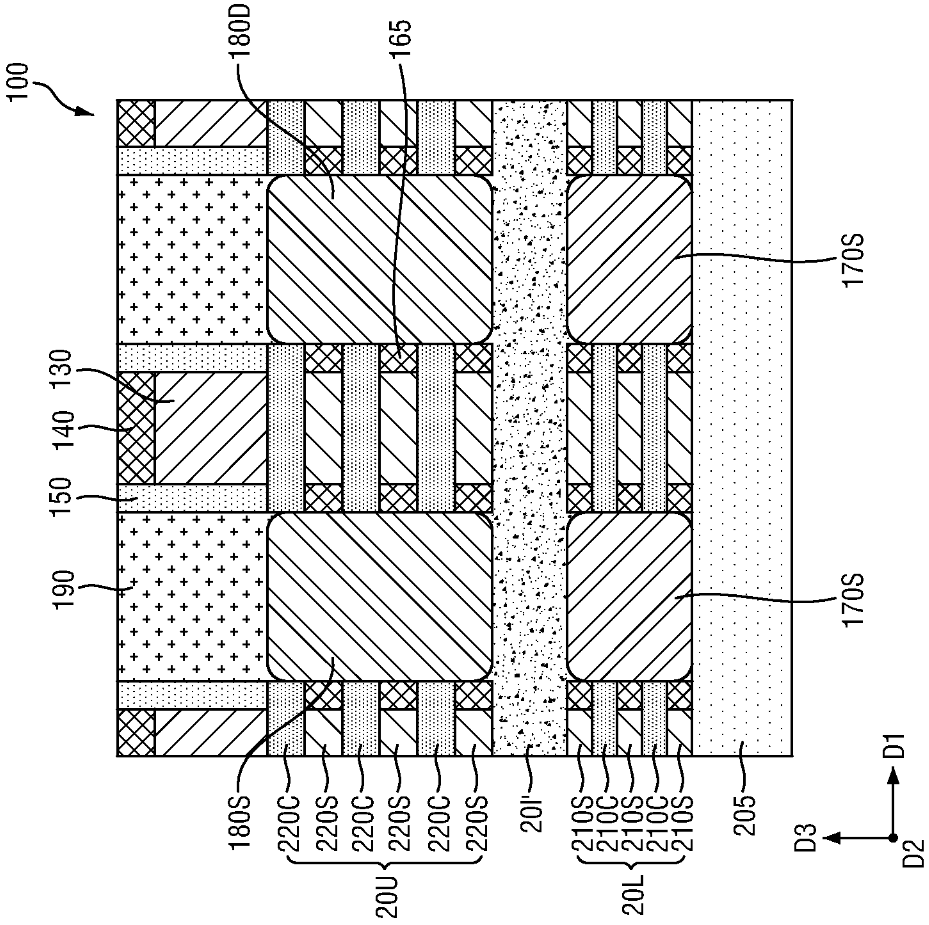
FIG. 11 illustrates a channel-length cross-section view of a multi-stack semiconductor device formed of a plurality of multi-stack nanosheet structures in which source/drain regions and an interlayer dielectric (ILD) structure are formed, according to an embodiment.

FIG. 11 illustrates a channel-length cross-section view of a multi-stack semiconductor device formed of a plurality of multi-stack nanosheet structures in which source/drain regions and an interlayer dielectric (ILD) structure are formed, according to an embodiment.

An ILD material may be deposited on the multi-stack nanosheet structures 70A to 70C, where the source/drain regions 170S, 170D, 180S and 180D are formed, at least to isolate these source/drain regions from each other or from other circuit elements. The deposited ILD material may be planarized so that top surfaces thereof may be coplanar with top surfaces of the hard mask pattern 140 and the gate spacer 150, thereby forming a multi-stack semiconductor device 100 with an ILD structure 190 as shown in FIG. 11

The ILD material to form the ILD structure 190 may include silicon oxide, not being limited thereto.

Figure 12:
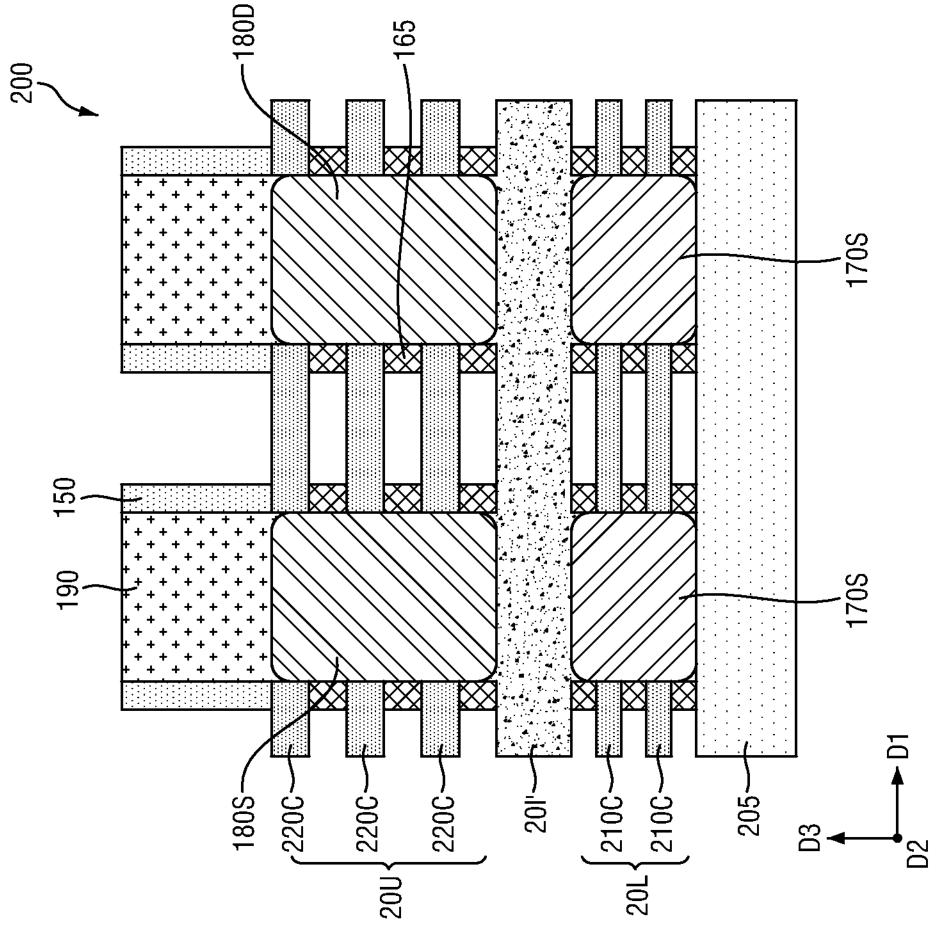
FIG. 12 illustrates a channel-length cross-section view of a multi-stack semiconductor device in which a dummy gate structure with a hard mask pattern thereon, sacrificial layers and sacrificial isolation layers having a same material as the sacrificial layers are removed to release channel layers in the multi-stack semiconductor device, according to an embodiment.

FIG. 12 illustrates a channel-length cross-section view of a multi-stack semiconductor device in which a dummy gate structure with a hard mask pattern thereon, sacrificial layers and sacrificial isolation layers having a same material as the sacrificial layers are removed to release channel layers in the multi-stack semiconductor device, according to an embodiment.

Referring to FIG. 12, the hard mask pattern 140 may be stripped away from the multi-stack semiconductor device 70 of FIG. 11, and the dummy gate structure 130 may be removed along with the sacrificial layers 210S and 220S, according to an embodiment. The removal operation in this step may include isotropic and/or anisotropic reactive ion etching (RIE), wet etching and/or a chemical oxide removal (COR) process, not being limited thereto. Thus, in a multi-stack semiconductor device 200 shown in FIG. 12, the channel layers 210C and 220C may be released from the sacrificial layers 210S and 220S that respectively surrounded the channel layers 210C and 220C in the multi-stack semiconductor device 100 of FIG. 11. By this channel release operation, the channel layers 210C and 220C may be exposed through an open space where a gate structure is to be formed in a subsequent step.

Figure 13A:
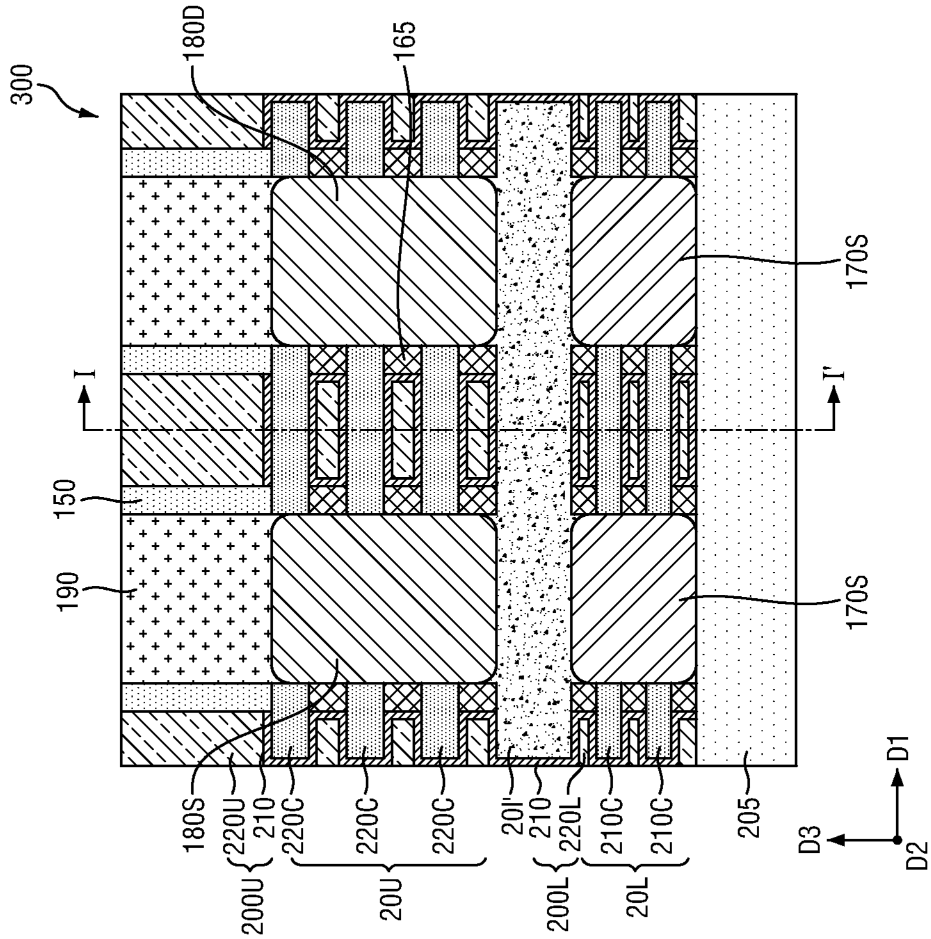
FIG. 13A illustrates a channel-length cross-section view of a multi-stack semiconductor device in which a gate structure is formed on channel layers to surround the channel layers, according to an embodiment.
Figure 13B:
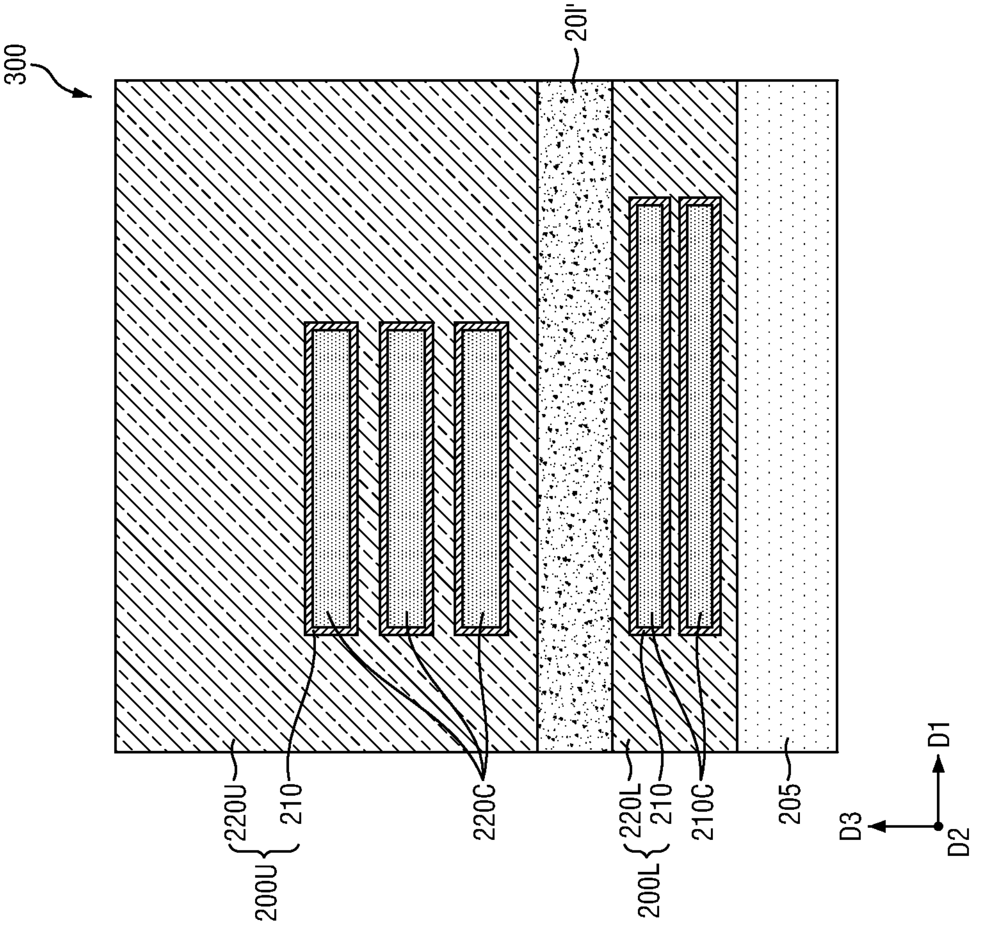
FIG. 13B illustrates a channel-width cross-section view of the multi-stack semiconductor device of FIG. 13A taken along line I-I' shown in FIG. 10A, according to an embodiment.

FIG. 13A illustrates a channel-length cross-section view of a multi-stack semiconductor device in which a gate structure is formed on channel layers to surround the channel layers, according to an embodiment. FIG. 13B illustrates a channel-width cross-section view of the multi-stack semiconductor device of FIG. 13A taken along line I-I' shown in FIG. 10A, according to an embodiment.

Referring to FIGS. 13A and 13B, a multi-stack semiconductor devices 300 may be obtained, in which a lower gate structure 200L and an upper gate structure 200U are filled in spaces where the dummy gate structure 130 and the sacrificial layers 210S, 220S are removed as shown in FIG. 12. Since the lower gate structure 200L and the upper gate structure 200U replace the dummy gate structure 130 and the sacrificial layers 210S, 220S in the multi-stack semiconductor device 100 shown in FIG. 11, they may be referred to as a replacement metal gate (RMG).

The lower gate structure 200L may include a gate dielectric layer 210 and a lower gate metal pattern 220L, and the upper gate structure 200U may include the same gate dielectric layer 210 and an upper gate metal pattern 220U.

The gate dielectric layer 210 may include an interfacial layer formed of silicon oxide and/or silicon oxynitride, not being limited thereto, and a high-k layer formed of hafnium oxide, hafnium silicate, hafnium oxynitride, hafnium silicon oxynitride, hafnium aluminum oxide, lanthanum oxide, lanthanum aluminum oxide, zirconium oxide, zirconium silicate, zirconium oxynitride, zirconium silicon oxynitride, titanium oxide, barium strontium titanium oxide, barium titanium oxide, strontium titanium oxide, yttrium oxide, aluminum oxide, tantalum oxide and/or lead scandium tantalum oxide, not being limited thereto.

Each of the lower gate metal pattern 220L and the upper gate metal pattern 220U may include a work-function metal layer and a conductor layer. The work-function metal layer may be formed of titanium (Ti), tantalum (Ta) or their compound, not being limited thereto, to modulate a desired threshold voltage for each of the lower gate structure 200L and the upper gate structure 200U of the multi-stack semiconductor device 300. Since an upper-stack nanosheet transistor formed from the upper nanosheet stack 20U is to be an NMOS, the work-function metal layer included in the upper gate metal pattern 220U may be formed of a combination of titanium nitride and titanium carbide, for example. In contrast, a lower-stack nanosheet transistor formed from the lower nanosheet stack 20L is to be a PMOS, the work-function metal layer included in the lower gate metal pattern 220L may be formed of titanium nitride without carbon, for example.

The conductor layer may be formed of copper (Cu), aluminum (Al), tungsten (W), molybdenum (Mo), ruthenium (Ru), cobalt (Co) or their compound, not being limited thereto, to receive an input voltage for the multi-stack semiconductor device 300 or for an internal routing of the multi-stack semiconductor device 300 to an adjacent circuit.

Through the formation of the lower gate structure 200L and the upper gate structure 200U as above, the multi-stack semiconductor device 300 may be formed of a lower-stack nanosheet transistor, which may be a PMOS, and an upper-stack nanosheet transistor, which may be an NMOS.

In the meantime, due to the smaller thickness of a spacer where the lower sacrificial layers 210S are removed, compared to a space where the upper sacrificial layers 220S are removed, portions of the lower gate metal pattern 220L formed in the space where the lower sacrificial layer 210S are removed may include only the work-function metal layer among the work-function metal layer and the conductor layer.

FIG. 14A illustrates a multi-stack semiconductor device in which a lower source/drain region contact structure and an upper source/drain region contact structure are connected to lower source/drain regions and upper source/drain regions, respectively, according to an embodiment. FIG. 14B illustrates a channel-width cross-section view of the multi-stack semiconductor device of FIG. 14A taken along line I-I' shown in FIG. 14A, according to an embodiment.

Referring to FIGS. 14A and 14B, upper source/drain region contact structures 180SC and 180DC are connected to the upper source/drain regions 180S and 180D, respectively, and a lower source/drain region contact structure 170SC is connected to the lower source/drain region 170S in the multi-stack semiconductor device 300 of FIGS. 13A and 13B. Although not shown another lower source/drain region contact structure may be connected to the lower source/drain region 170D.

The source/drain region contact structures 170SC, 180SC and 180DC may be formed by dry etching and/or wet etching, not being limited thereto, on the ILD structure 190 of the multi-stack semiconductor device 300. The source/drain region contact structures 170SC, 180SC and 180DC may include a conductor metal such as copper (Cu), cobalt (Co), tungsten (W), ruthenium (Ru), or a combination thereof, not being limited thereto.

FIG. 14B shows that a width of the upper source/drain region 180S is smaller than that of the lower source/drain region 170S. This is because, as described in reference to FIGS. 1B and 13B, the upper channel structure including the upper channel layers 220C has a smaller channel width than the lower channel structure including the lower channel layers 210C, and thus, the upper source/drain region 180S is epitaxially grown from the upper channel structure smaller than the lower channel structure from which the lower source/drain region 170S is epitaxially grown.

In the above embodiments, each of the multi-stack semiconductor devices formed of the multi-stack nanosheet structures 10 to 40 shown in FIGS. 1A-1B to 4, respectively, may be formed a lower-stack nanosheet transistor and an upper-stack nanosheet transistor of different polarity types, that is, PMOS and NMOS. Further, in the above embodiments, the PMOS has a greater thickness in at least one of a gate structure, replacing sacrificial layers, and a channel layer than the NMOS to achieve a CMOS device having an optimal performance. However, this thickness difference may also be applied to a multi-stack semiconductor device formed of same polarity-type nanosheet transistors having different gate-controlling threshold voltages at its upper stack and lower stack, according to an embodiment.

Figure 15:
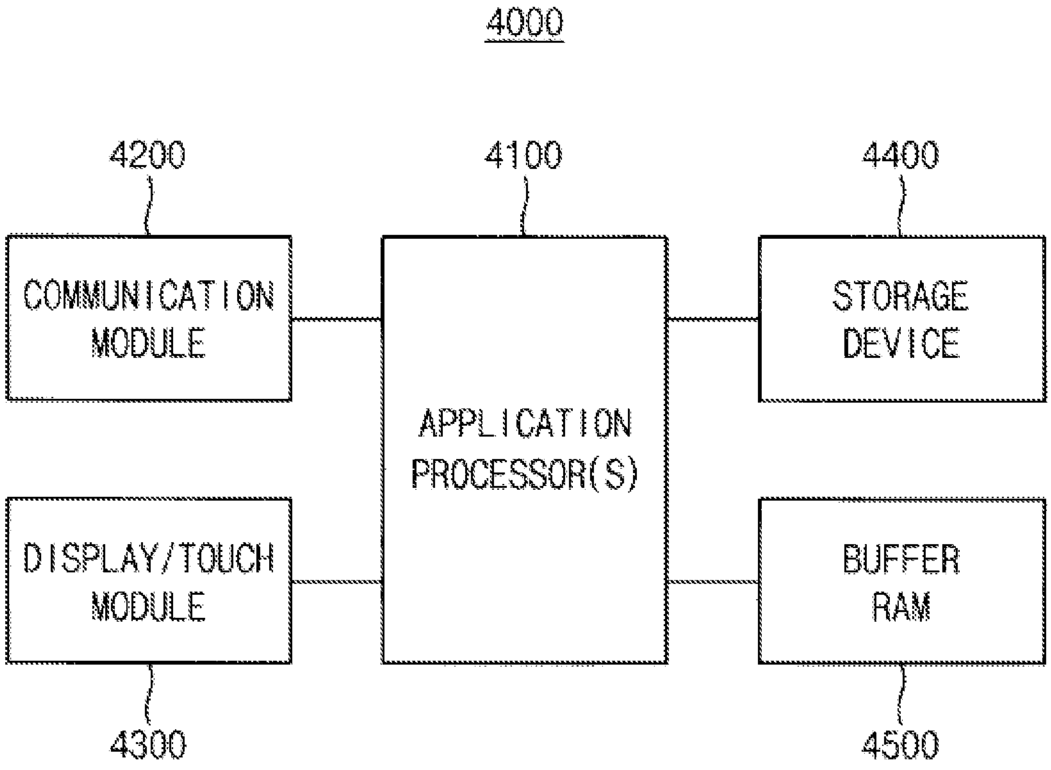
FIG. 15 is a schematic block diagram illustrating an electronic device including a multi-stack semiconductor device, according to an example embodiment.

FIG. 15 is a schematic block diagram illustrating an electronic device including a multi-stack semiconductor device having improved channel and gate structures, according to an example embodiment.

Referring to FIG. 153, an electronic device 4000 may include at least one application processor 4100, a communication module 4200, a display/touch module 4300, a storage device 4400, and a buffer RAM 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the electronic device 4000 may include a multi-stack semiconductor devices manufactured based on at least one of the multi-stack nanosheet structures 10 to 40 described above in reference to FIGS. 1A-1B to 14A to 14C.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A multi-stack semiconductor device comprising:

a substrate;

a lower-stack nanosheet transistor comprising at least one lower channel layer surrounded by a lower gate structure, the at least one lower channel layer connecting lower source/drain regions; and an upper-stack nanosheet transistor formed above the lower-stack nanosheet transistor, and comprising at least one upper channel layer surrounded by an upper gate structure, the at least one upper channel layer connecting upper source/drain regions, wherein one of the at least one lower channel layer and one of the at least one upper channel layer have different thicknesses, and wherein a thickness of the lower-stack nanosheet transistor is different from a thickness of the upper-stack nanosheet transistor.

2. The multi-stack semiconductor device of claim 1, wherein the at least one lower channel layer has a greater channel width than the at least one upper channel layer.

3. The multi-stack semiconductor device of claim 2, wherein the at least one upper channel layer has a greater thickness than the at least one lower channel layer.

4. The multi-stack semiconductor device of claim 3, wherein the upper- stack nanosheet transistor is a p-type metal-oxide-semiconductor field-effect transistor (PMOS), and the lower-stack nanosheet transistor is an n-type metal-oxide-semiconductor field-effect transistor (NMOS).

5. The multi-stack semiconductor device of claim 4, wherein the at least one lower channel layer comprises two or more lower channel layers, and the at least one upper channel layer comprises two or more upper channel layers, and wherein the upper gate structure between two adjacent upper channel layers and the lower gate structure between two adjacent lower channel layers have different thicknesses.

6. The multi-stack semiconductor device of claim 5, wherein the upper gate structure between the two adjacent upper channel layers has a greater thickness than the lower gate structure between the two adjacent lower channel layers.

7. The multi-stack semiconductor device of claim 6, wherein one of the two adjacent upper channel layers and the upper gate structure between the two adjacent upper channel layers have an equal thickness.

8. The multi-stack semiconductor device of claim 7, wherein one of the two adjacent lower channel layers and the lower gate structure between the two adjacent lower channel layers have an equal thickness.

9. The multi-stack semiconductor device of claim 4, wherein the at least one lower channel layer comprises two or more lower channel layers, and the at least one upper channel layer comprises two or more upper channel layers, and wherein the upper gate structure between two adjacent upper channel layers and the lower gate structure between two adjacent lower channel layers have an equal thickness, which is greater than a thickness of each of the lower channel layers or each of the upper channel layers.

10. The multi-stack semiconductor device of claim 2, the at least one lower channel layer has a greater thickness than the at least one upper channel layer.

11. The multi-stack semiconductor device of claim 10, wherein the upper-stack nanosheet transistor is an n-type metal-oxide-semiconductor field-effect transistor (NMOS), and the lower-stack nanosheet transistor is a p-type metal-oxide-semiconductor field-effect transistor (PMOS).

12. The multi-stack semiconductor device of claim 1, wherein the at least one lower channel layer comprises two or more lower channel layers, and the at least one upper channel layer comprises two or more upper channel layers, and wherein the upper gate structure between two adjacent upper channel layers and the lower gate structure between two adjacent lower channel layers have different thicknesses.

13. The multi-stack semiconductor device of claim 12, wherein the upper gate structure between the two adjacent upper channel layers has a greater thickness than the lower gate structure between the two adjacent lower channel layers.

14. A multi-stack semiconductor device comprising:

a substrate;

a lower-stack nanosheet transistor comprising two or more lower channel layers surrounded by a lower gate structure, the lower channel layers connecting lower source/drain regions; and an upper-stack nanosheet transistor formed above the lower-stack nanosheet transistor, and comprising two or more upper channel layers surrounded by an upper gate structure, the upper channel layers connecting upper source/drain regions, wherein at least one of the lower channel layers and at least one of the upper channel layers have different thicknesses, wherein the upper gate structure between two adjacent upper channel layers and the lower gate structure between two adjacent lower channel layers have different thicknesses, and wherein a thickness of the lower-stack nanosheet transistor is different from a thickness of the upper-stack nanosheet transistor.

15. The multi-stack semiconductor device of claim 14, wherein the upper gate structure between the two adjacent upper channel layers has a greater thickness than the lower gate structure between the two adjacent lower channel layers.

16. The multi-stack semiconductor device of claim 14, wherein at least one of the two adjacent lower channel layers and the lower gate structure between the two adjacent lower channel layers have different thicknesses, and wherein at least one of the two adjacent upper channel layers and the upper gate structure between the two adjacent upper channel layers have different thicknesses.

17. The multi-stack semiconductor device of claim 16, wherein the upper gate structure between the two adjacent upper channel layers has a greater thickness than the lower gate structure between the two adjacent lower channel layers.

18. The multi-stack semiconductor device of claim 17, wherein the at least one of the upper channel layers has a greater thickness than the one of the lower channel layers.

19. The multi-stack semiconductor device of claim 18, wherein the at least one of the lower channel layers has a greater channel width than the one of the upper channel layers.

20. The multi-stack semiconductor device of claim 19, wherein the upper-stack nanosheet transistor is a p-type metal-oxide-semiconductor field-effect transistor (PMOS), and the lower-stack nanosheet transistor is an n-type metal-oxide-semiconductor field-effect transistor (NMOS).

21. A multi-stack semiconductor device comprising:

a substrate;

a lower-stack nanosheet transistor comprising two or more lower channel layers surrounded by a lower gate structure, the lower channel layers connecting lower source/drain regions; and an upper-stack nanosheet transistor formed above the lower-stack nanosheet transistor, and comprising two or more upper channel layers surrounded by an upper gate structure, the upper channel layers connecting upper source/drain regions, wherein the lower-stack nanosheet transistor and the upper-stack nanosheet transistor have at least one of:

a difference between a thickness of one of the lower channel layers and a thickness of one of the upper channel layers; and a difference between a thickness of the lower gate structure between two adjacent lower channel layers and a thickness of the upper gate structure between two adjacent upper channel layers, and wherein a thickness of the lower-stack nanosheet transistor is different from a thickness of the upper-stack nanosheet transistor.

22. The multi-stack semiconductor device of claim 21, wherein the one of the lower channel layers has a greater channel width than the one of the upper channel layers.

23. The multi-stack semiconductor device of claim 22, wherein one of the lower-stack nanosheet transistor and the upper-stack nanosheet transistor is a p-type metal-oxide-semiconductor field-effect nanosheet transistor (PMOS), and the other of the lower-stack nanosheet transistor and the upper-stack nanosheet transistor is an n-type metal-oxide-semiconductor field-effect transistor (NMOS).

* * * * *